(12) United States Patent
Ranta et al.

(10) Patent No.: US 9,106,227 B2
(45) Date of Patent: Aug. 11, 2015

(54) DEVICES AND METHODS FOR IMPROVING VOLTAGE HANDLING AND/OR BI-DIRECTIONALITY OF STACKS OF ELEMENTS WHEN CONNECTED BETWEEN TERMINALS

(71) Applicant: PEREGRINE SEMICONDUCTOR CORPORATION, San Diego, CA (US)

(72) Inventors: Tero Tapio Ranta, San Diego, CA (US); Shawn Bawell, Amherst, NH (US); Robert W. Greene, Lowell, MA (US); Christopher N. Brindle, Poway, CA (US); Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/178,116

(22) Filed: Feb. 11, 2014

(65) Prior Publication Data
US 2014/0312958 A1  Oct. 23, 2014

Related U.S. Application Data

(60) Division of application No. 12/803,139, filed on Jun. 18, 2010, now Pat. No. 8,669,804, which is a continuation-in-part of application No. PCT/US2009/001358, filed on Mar. 2, 2009.

(60) Provisional application No. 61/067,634, filed on Feb. 28, 2008.

(51) Int. Cl.
*H03K 17/687* (2006.01)
*H03K 17/16* (2006.01)
(Continued)

(52) U.S. Cl.
CPC ............ *H03K 17/162* (2013.01); *H03K 17/687* (2013.01); *H03M 1/1061* (2013.01); *H03J 2200/10* (2013.01); *H03M 1/804* (2013.01)

(58) Field of Classification Search
USPC ......................................................... 327/427
See application file for complete search history.

(56) References Cited

U.S. PATENT DOCUMENTS 3,646,361 A  2/1972 Pfiffner
3,699,359 A  10/1972 Shelby
(Continued)

FOREIGN PATENT DOCUMENTS

CN  1256521  6/2000
DE  19832565  8/1999
(Continued)

OTHER PUBLICATIONS

Minoli, "Telecommunications Technology Handbook", Artech House, 2003.
(Continued)

*Primary Examiner* — Daniel Puentes
(74) *Attorney, Agent, or Firm* — Jaquez Land Richman LLP; Martin J. Jaquez, Esq.; Alessandro Steinfl, Esq.

(57) ABSTRACT

Devices and methods for improving voltage handling and/or bi-directionality of stacks of elements when connected between terminals are described. Such devices and method include use of symmetrical compensation capacitances, symmetrical series capacitors, or symmetrical sizing of the elements of the stack.

8 Claims, 27 Drawing Sheets

(51) Int. Cl.
*H03M 1/10* (2006.01)
*H03M 1/80* (2006.01)

(56) References Cited

U.S. PATENT DOCUMENTS

| | | |
|---|---|---|
| 3,975,671 A | 8/1976 | Stoll |
| 3,988,727 A | 10/1976 | Scott |
| 4,053,916 A | 10/1977 | Cricchi et al. |
| 4,244,000 A | 1/1981 | Ueda et al. |
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,849,651 A | 7/1989 | Estes, Jr. |
| 4,890,077 A | 12/1989 | Sun |
| 4,891,609 A | 1/1990 | Eilley |
| 4,893,070 A | 1/1990 | Milberger et al. |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,124,762 A | 6/1992 | Childs et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,345,422 A | 9/1994 | Redwine |
| 5,350,957 A | 9/1994 | Cooper et al. |
| 5,375,257 A | 12/1994 | Lampen |
| 5,405,795 A | 4/1995 | Beyer et al. |
| 5,416,043 A | 5/1995 | Burgener et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,784,687 A | 7/1998 | Itoh et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,013,958 A | 1/2000 | Aytur |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,694 A | 6/2000 | Matsuura et al. |
| 6,084,255 A | 7/2000 | Ueda et al. |

(56) References Cited

U.S. PATENT DOCUMENTS

| | | |
|---|---|---|
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,122,185 A | 9/2000 | Utsunomiya et al. |
| 6,133,752 A | 10/2000 | Kawagoe |
| 6,160,292 A | 12/2000 | Flaker et al. |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shino |
| 6,195,307 B1 | 2/2001 | Umezawa et al. |
| 6,201,761 B1 | 3/2001 | Wollesen |
| RE37,124 E | 4/2001 | Monk et al. |
| 6,215,360 B1 | 4/2001 | Callaway, Jr. |
| 6,218,248 B1 | 4/2001 | Hwang et al. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,320,225 B1 | 11/2001 | Hargrove et al. |
| 6,337,594 B1 | 1/2002 | Hwang |
| 6,341,087 B1 | 1/2002 | Kunikiyo |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Sakai et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,414,863 B1 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,531,356 B1 | 3/2003 | Hayashi |
| 6,537,861 B1 | 3/2003 | Kroell et al. |
| 6,559,689 B1 | 5/2003 | Clark |
| 6,563,366 B1 | 5/2003 | Kohama |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,677,641 B2 | 1/2004 | Kocon |
| 6,677,803 B1 | 1/2004 | Chiba |
| 6,683,499 B2 | 1/2004 | Lautzenhiser et al. |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,698,498 B1 | 3/2004 | Ziegelaar et al. |
| 6,703,863 B2 | 3/2004 | Gion |
| 6,711,397 B1 | 3/2004 | Petrov et al. |
| 6,714,065 B2 | 3/2004 | Komiya et al. |
| 6,717,458 B1 | 4/2004 | Potanin |
| 6,747,522 B2 | 6/2004 | Pietruszynski et al. |
| 6,753,738 B1 | 6/2004 | Baird |
| 6,762,477 B2 | 7/2004 | Kunikiyo |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,889,036 B2 | 5/2005 | Ballweber et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,906,653 B2 | 6/2005 | Uno |
| 6,908,832 B2 | 6/2005 | Farrens et al. |
| 6,917,258 B2 | 7/2005 | Kushitani et al. |
| 6,933,744 B2 | 8/2005 | Das et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 6,992,543 B2 | 1/2006 | Luetzeischwab et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Kukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,190,933 B2 | 3/2007 | De Ruijter et al. |
| 7,199,635 B2 | 4/2007 | Nakatsuka et al. |
| 7,212,788 B2 | 5/2007 | Weber et al. |
| 7,269,392 B2 | 9/2007 | Nakajima et al. |
| 7,299,018 B2 | 11/2007 | Van Rumpt |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe et al. |
| 7,405,982 B1 | 7/2008 | Flaker et al. |
| 7,432,552 B2 | 10/2008 | Park |
| 7,460,852 B2 | 12/2008 | Burgener et al. |
| 7,515,882 B2 | 4/2009 | Kelcourse et al. |
| 7,518,458 B2 | 4/2009 | Nakamura et al. |

(56) References Cited

U.S. PATENT DOCUMENTS

| | | |
|---|---|---|
| 7,546,089 B2 | 6/2009 | Bellantoni |
| 7,554,789 B2 | 6/2009 | Chen |
| 7,561,853 B2 | 7/2009 | Miyazawa |
| 7,616,482 B2 | 11/2009 | Prall |
| 7,659,152 B2 | 2/2010 | Gonzalez et al. |
| 7,714,676 B2 | 5/2010 | McKinzie |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,796,969 B2 | 9/2010 | Kelly et al. |
| 7,825,715 B1 | 11/2010 | Greenberg |
| 7,860,499 B2 | 12/2010 | Burgener et al. |
| 7,910,993 B2 | 3/2011 | Brindle et al. |
| 7,928,759 B2 | 4/2011 | Hidaka |
| 7,960,772 B2 | 6/2011 | Englekirk |
| 7,982,265 B2 | 7/2011 | Challa et al. |
| 8,138,816 B2 | 3/2012 | Freeston et al. |
| 8,536,636 B2 | 9/2013 | Englekirk |
| 8,583,111 B2 | 11/2013 | Burgener et al. |
| 8,604,864 B2 | 12/2013 | Ranta et al. |
| 8,638,159 B2 | 1/2014 | Ranta et al. |
| 8,669,804 B2 | 3/2014 | Ranta et al. |
| 8,803,631 B2 | 8/2014 | Manssen et al. |
| 9,024,700 B2 | 5/2015 | Ranta |
| 2001/0015461 A1 | 8/2001 | Ebina |
| 2001/0031518 A1 | 10/2001 | Kim et al. |
| 2001/0040479 A1 | 11/2001 | Zhang |
| 2001/0045602 A1 | 11/2001 | Maeda et al. |
| 2002/0115244 A1 | 8/2002 | Park et al. |
| 2002/0195623 A1 | 12/2002 | Horiuchi et al. |
| 2003/0002452 A1 | 1/2003 | Sahota |
| 2003/0141543 A1 | 7/2003 | Bryant et al. |
| 2003/0181167 A1 | 9/2003 | Iida |
| 2003/0201494 A1 | 10/2003 | Maeda et al. |
| 2003/0205760 A1 | 11/2003 | Kawanaka et al. |
| 2003/0222313 A1 | 12/2003 | Fechner |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2004/0242182 A1 | 12/2004 | Hidaka et al. |
| 2005/0017789 A1 | 1/2005 | Burgener et al. |
| 2005/0068103 A1 | 3/2005 | Dupuis et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0127442 A1 | 6/2005 | Veeraraghavan et al. |
| 2005/0167751 A1 | 8/2005 | Nakajima et al. |
| 2005/0285684 A1 | 12/2005 | Burgener et al. |
| 2005/0287976 A1 | 12/2005 | Burgener et al. |
| 2006/0009164 A1 | 1/2006 | Kataoka |
| 2006/0077082 A1 | 4/2006 | Shanks et al. |
| 2006/0160520 A1 | 7/2006 | Miyazawa |
| 2006/0161520 A1 | 7/2006 | Brewer et al. |
| 2006/0194558 A1 | 8/2006 | Kelly |
| 2006/0194567 A1 | 8/2006 | Kelly et al. |
| 2006/0270367 A1 | 11/2006 | Burgener et al. |
| 2007/0018247 A1 | 1/2007 | Brindle et al. |
| 2007/0023833 A1 | 2/2007 | Okhonin et al. |
| 2007/0045697 A1 | 3/2007 | Cheng et al. |
| 2007/0279120 A1 | 12/2007 | Brederlow et al. |
| 2008/0073719 A1 | 3/2008 | Fazan et al. |
| 2008/0076371 A1 | 3/2008 | Dribinsky et al. |
| 2008/0106349 A1 | 5/2008 | McKinzie |
| 2008/0265978 A1* | 10/2008 | Englekirk .................... 327/427 |
| 2008/0303080 A1 | 12/2008 | Bhattacharyya |
| 2009/0029511 A1 | 1/2009 | Wu |
| 2009/0224843 A1 | 9/2009 | Radoias et al. |
| 2011/0001542 A1 | 1/2011 | Ranta et al. |
| 2011/0001544 A1 | 1/2011 | Ranta et al. |
| 2011/0002080 A1 | 1/2011 | Ranta |
| 2011/0043271 A1 | 2/2011 | Ranta et al. |
| 2011/0163779 A1 | 7/2011 | Hidaka |
| 2011/0227666 A1 | 9/2011 | Manssen et al. |
| 2013/0208396 A1 | 8/2013 | Bawell et al. |
| 2013/0222075 A1 | 8/2013 | Reedy et al. |
| 2014/0165385 A1 | 6/2014 | Englekirk |
| 2014/0312957 A1 | 10/2014 | Ranta et al. |

FOREIGN PATENT DOCUMENTS

| | | |
|---|---|---|
| EP | 385641 | 9/1990 |
| EP | 0622901 | 11/1994 |
| EP | 782267 | 7/1997 |
| EP | 913939 | 5/1999 |
| EP | 625831 | 11/1999 |
| EP | 1006584 | 7/2000 |
| EP | 2568608 | 5/2014 |
| EP | 2760136 | 7/2014 |
| JP | 55-75348 | 6/1980 |
| JP | S63-164352 | 7/1988 |
| JP | 1254014 | 10/1989 |
| JP | 2161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | 06-334506 | 12/1994 |
| JP | 7046109 | 2/1995 |
| JP | 2007-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | 08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 9163721 | 6/1997 |
| JP | 09-200021 | 7/1997 |
| JP | 9181641 | 7/1997 |
| JP | 9186501 | 7/1997 |
| JP | 9200074 | 7/1997 |
| JP | 9238059 | 9/1997 |
| JP | 9243738 | 9/1997 |
| JP | 09-008621 | 10/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 200157487 | 5/2001 |
| JP | 2001156182 | 6/2001 |

(56) References Cited

FOREIGN PATENT DOCUMENTS

| | | |
|---|---|---|
| JP | 2001-510006 | 7/2001 |
| JP | 2001274265 | 10/2001 |
| JP | 2002-033660 | 1/2002 |
| JP | 2002-098712 | 4/2002 |
| JP | 2004515937 | 5/2002 |
| JP | 2000358775 | 6/2002 |
| JP | 2003060451 | 2/2003 |
| JP | 2003101407 | 4/2003 |
| JP | 2003-516083 | 5/2003 |
| JP | 2003143004 | 5/2003 |
| JP | 2003167615 | 6/2003 |
| JP | 2003189248 | 7/2003 |
| JP | 2003332583 | 11/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-203643 | 7/2005 |
| JP | 2006-332778 | 12/2006 |
| JP | 5417346 | 11/2013 |
| JP | 55921356 | 8/2014 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO99/49565 | 9/1999 |
| WO | WO01/41306 | 6/2001 |
| WO | WO0227920 | 4/2002 |
| WO | 2006/038190 | 4/2006 |
| WO | WO2006038190 | 4/2006 |
| WO | 2007/008934 | 1/2007 |
| WO | WO2007033045 A2 | 3/2007 |
| WO | 2007/060210 | 5/2007 |
| WO | WO-2008/133621 | 11/2008 |
| WO | WO-2009/108391 | 9/2009 |

OTHER PUBLICATIONS

Morreale, "The CRC Handbook of Modern Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Nguyen, Niki Hoang, Office Action received from the USPTO dated Sep. 26, 2012 for related U.S. Appl. No. 13/277,108, 47 pgs.
Nishide, Ryuji, Translation of Japanese Office Action received from the JP dated Jul. 17, 2012 for related appln. No. 2008-521544, 4 pgs.
Willert-Porada, M., "Advanced in Microwave and Radio Frequency Processing", 8th International Conference on Microwave and High-Frequency Heating, Sep. 3-7, 2001.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science + Business Media, 2000.
Brinkman, et al., Respondents' Notice of Prior Art, Investigation No. 337-TA-848, dated Aug. 31, 2012, 59 pgs.
Lauterbach, Christi, "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.
Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Quality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.
Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Giffard, et al., "Dynamic Effects in SOI MOSFET's", IEEE, 1991, pp. 160-161.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Assaderaghi, et al., "Dynamic Threshold-Voltage MOSFET (DTMOS) for Ultra-Low Voltage VLSI", IEEE Transactions on Electron, vol. 44, No. 3, Mar. 1997, pp. 414-422.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Lee, et al., "Effects of Gate Structure on the RF Performance in PD SOI MOSFETs", IEEE Microwave and Wireless Components Letters, vol. 15, No. 4, Apr. 2005.
Krishnan, "Efficacy of Body Ties Under Dynamic Switching Conditions in Partially Depleted SOI CMOS Technology", Proceedings IEEE Int'l SOI Conference, Oct. 1997, pp. 140-141.
Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Lee, et al., "Harmonic Distortion Due to Narrow Width Effects in Deep Submicron SOI-CMOS Device for Analog-RF Applications", IEEE Int'l SOI Conference, Oct. 2002, pp. 83-85.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Damiano, et al., "Integrated Dynamic Body Contact for H Gate PD SOI MOSFETs for High Performance/Low Power", IEEE SOI Conference, Oct. 2004, pp. 115-116.
Tat, International Search Report and Written Opinion received from USRO dated Jul. 3, 2008 for related appin. No. PCT/US06/36240.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.

(56) References Cited

OTHER PUBLICATIONS

Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.

Keys, "Low Distortion Mixers or RF Communications", Ph.D. Thesis, University of California-Berkeley, 1995.

Suehle, et al., "Low Electric Field Breakdown of Thin SiO2 Films Under Static and Dynamic Stress", IEEE Transactions on Electron Devices, vol. 44, No. 5, May 1997.

Chen, et al., "Low Power, Multi-Gigabit DRAM Cell Design Issues Using SOI Technologies", http://bwrc.eecs.berkeley.edu/people/grad_students/chenff/reports, May 1999.

Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.

Wei, "Measurement and Modeling of Transient Effects in Partially Depleted SOI MOSFETs", M.S. Thesis, MIT, Jul. 1996.

Wei, et al., "Measurement of Transient Effects in SOI DRAM/SRAM Access Transistors", IEEE Electron Device Letters, vol. 17, No. 5, May 1996.

Shoucair, "Modeling, Decoupling and Supression of MOSFET Distortion Components", IEEE Proceeding Circuit Devices Systems, vol. 146, No. 1, Feb. 1999.

Tat, Notice of Allowance received from USPTO dated Sep. 16, 2010 U.S. Appl. No. 11/520,912.

Shingleton, Office Action received from USPTO dated Oct. 7, 2008 U.S. Appl. No. 11/881,816.

Tat, Office Action received from the USPTO dated Dec. 10, 2009 U.S. Appl. No. 11/520,912.

Shingleton, Office Action received from USPTO dated Jan. 19, 2010 for U.S. Appl. No. 11/881,816.

Tat, Office Action received from USPTO dated Jul. 8, 2009 for U.S. Appl. No. 11/520,912.

Tat, Office Action received from USPTO dated Sep. 15, 2008 for U.S. Appl. No. 11/520,912.

Shahidi, et al., "Partially Depleted SOI Technology for Digital Logic", IEEE Int'l Solid-State Circuits Conference, 1999, pp. 426-427.

Stuber, et al., Photocopy of an amendment that was filed with the USPTO dated Mar. 16, 2009 for U.S. Appl. No. 11/520,912.

Stuber, et al., Photocopy of an amendment that was filed with the USPTO dated Sep. 8, 2009 for U.S. Appl. No. 11/520,912.

Photocopy of a translation of an Office Action dated Jul. 31, 2009 for Chinese appln. No. 200680025128.7.

Hameau, et al., "Radio-Frequency Circuits in Integration Using CMOS SOI 0.25um Technology", 2002 RF IC Design Workshop Europe, Mar. 2002, Grenoble, France.

Barker, Communications Electronics-Systems, Circuits, and Devices, 1987, Prentice-Hall.

Carr, "Secrets of RF Circuit Design", McGraw-Hill, 1997.

Couch, "Digital and Analog Communication Systems", 2001, Prentice-Hall.

Couch, "Modern Telecommunication System", Prentice-Hall, 1995.

Freeman, "Radio System Design for Telecommunications", Wiley, 1997.

Copenheaver, Brian, International Search Report and Written Opinion for related appln. No. PCT/US2009/001358 dated May 27, 2009, 11 pages.

Peregrine Semiconductor Corporation, Article 19 Amendment Letter Under Section 205(b) and Rule 46.5 (b) PCT filed in WIPO for related appln. No. PCT/US2009/001358, dated Aug. 11, 2009, 12 pages.

Kao, W.H., et al., "Parasitic extraction: current state of the art and future trends", Proceedings of the IEEE, May 2001, vol. 89, Issue 5, pp. 729-739.

Brambilla, A., et al., "Measurements and extractions of parasitic capacitances in ULSI layouts", Electron Devices, IEEE Transactions, Nov. 2003, vol. 50, Issue 11, pp. 2236-2247.

Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.

Nabors, et al., "FastCap: A Multipole Accelerated 3-D Capacitance Extraction Program, IEEE Transactions on Computer-Aided Design", vol. 10, No. 11, Nov. 1991, pp. 1447-1459.

Nabors, et al., "Fast Capacitance Extraction of General Three-Dimensional Structures", IEEE Transactions on Microwave Theory and Techniques, vol. 40, No. 7, Jul. 1992, pp. 1496-1506.

Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.

Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.

Nabors, et al., "A Fast Multipole Algorithm for Capacitance Extraction of Complex 3-D Geometries", IEEE 1989 Custom Integrated Circuits Conference, May 1989, pp. 21.7.1-21.7.4.

Nabors, et al., "Fast Capacitance Extraction of General Three-Dimensional Structures", Proc. Int. Conf. on Computer Design, Cambridge, MA, Oct. 1991, pp. 479-484.

Nabors, et al., "Including Conformal Dielectrics in Multipole-Accelerated Three-Dimensional Interconnect Capacitance Extraction", proceedings of NUPAD IV, Seattle, WA, May 1992, 2 pgs.

Nabors, et al. "Multipole-Accelerated 3-D Capacitance Extraction Algorithms for Structures with Conformal Dielectrics", Procedding of the 29th Design Automation Conference, Anaheim, CA, Jun. 1992, pp. 710-715.

Phillips, et al., "A Precorrected-FFT method for Capacitance Extraction of Complicated 3-D Structures", Int. Conf. on Computer-Aided Design, Santa Clara, CA, Nov. 1994, 4 pgs.

Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.

Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.

Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.

Young, Lee W., International Search Report received from USRO for related appln. No. PCT/US2007/10331 dated Feb. 15, 2008, 14 pages.

Englekirk, Robert, Preliminary Amendment filed in the USPTO for related appln. No. 11/796,522 dated Sep. 11, 2009, 9 pgs.

Patel, Reema, Office Action received from the USPTO for related appln. No. 11/796,522 dated Oct. 2, 2009, 6 pages.

Englekirk, Robert, Response filed in the USPTO for related appln. No. 11/796,522 dated Nov. 2, 2009, 3 pgs.

Shifrin, M., et al., "Monolithic FET Structures for High-Power Control Component Applications", IEEE Transactions on Microwave Theory and Techniques, IEEE Service Center, Piscataway, NJ, US., vol. 37, No. 12, Dec. 1, 1989, pp. 2134-2141.

Shifrin, M., et al., "High Power Control Components using a New Monolithic FET Structure", 19890612; 19890612-19890613, Jun. 12, 1989, pp. 51-56, XP010087270.

Volker, Simon, Communication from the European Patent Office for related application No. 09174085.2-1233 dated Dec. 3, 2009, 6 pgs.

European Patent Office, Communication Pursuant to Rules 161 and 162 EPC received for related appln. No. 07794407.2 dated Dec. 10, 2009, 2 pgs.

Volker, Simon, European Search Report received from the EPO for related appln. No. 07794407.2, dated Mar. 12, 2010, 8 pgs.

Patel, Reema, Office Action received from the USPTO for related U.S. Appl. No. 11/796,522, dated Mar. 2, 2010, 8 pages.

Englekirk, Robert, Amendment filed in the USPTO for related U.S. Appl. No. 11/796,522, dated Jun. 2, 2010, 10 pgs.

(56) References Cited

OTHER PUBLICATIONS

Volker, Simon, Communication Pursuant to Article 94(3) EPC received from the EPO for related appln. No. 09174085.2 dated May 4, 2010, 1 pg.
Volker, Simon, Communication Pursuant to Article 94(3) EPC received from the EPO for related appln. No. 07794407.2 dated Jun. 15, 2010, 1 pg.
Peregrine Semiconductor Corporation, Response filed in the EPO for related appln. No. 07794407.2 dated Oct. 20, 2010, 13 pgs.
Peregrine Semiconductor Corporation, Response filed in the EPO for related appln. No. 09174085.2 dated Oct. 20, 2010, 14 pgs.
Patel, Reema, Office Action received from the USPTO for related U.S. Appl. No. 11/796,522, dated Aug. 30, 2010, 15 pgs.
Englekirk, Robert, response filed in the USPTO for related U.S. Appl. No. 11/796,522, dated Dec. 30, 2010, 17 pgs.
Novak, Rodd, "Overcoming the RF Challenges of Multiband Mobile Handset Design", RF/Microwave Switches and Connectors, published Jul. 20, 2007, www.rfdesign.com, 3 pgs.
Qiao, et al., "Antenna Impedance Mismatch Measurement and Correction for Adaptive CDMA Transceivers", Published Jun. 12-17, 2005, by the IEEE in the 2005 Microwave Symposium Digest, 2005 IEEE MTT-S International, pp. 4, et seq.
Sjoblom, Peter, "An Adaptive Impedance Tuning CMOS Circuit for ISM 2.4-GHz Band", Published in the IEEE Transactions on Circuits and Systems—1: Regular Papers, vol. 52, No. 6, pp. 1115-1124, Jun. 2005.
Sjoblom, Peter, "Measured CMOS Switched High-Quality Capacitors in a Reconfigurable Matching Network", IEEE Transactions on Circuits and Systems -II: Express Briefs, vol. 54, No. 10, Oct. 2007, pp. 858-862.
Patel, Reema, Notice of Allowance received from the USPTO for related U.S. Appl. No. 11/796,522, dated Jan. 28, 2011, 9 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, Vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration entitled "SOI CMOS Device Having Body Extension for Providing Sidewall Channel Stop and Bodytie", Reg. No. H1435, published May 2, 1995, 12 pgs.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays, Temic Semiconductors" 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to appln. No. PCT/US09/32266/.
Marenk, et al., "Layout Optimization of Cascode RF SOI Transistors", IEEE International SOI Conference, 2001, pp. 105-106.
Suematsu et al., "L-Band Internally Matched Si-MMIC Front End", IEEE, 1996, pp. 2375-2378.
Adan, et al., "Linearity and Low Noise Performance of SOIMOSFETs for RF Applications", IEEE International SOI Conference, 2000, pp. 30-31.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Megahed, et al., "Low Cost UTSi Technology for RF Wireless Applications", IEEE MTT-S Digest, 1998.

(56) References Cited

OTHER PUBLICATIONS

Luu, Final Office Action received from the USPTO dated Apr. 2009 relating to U.S. Appl. No. 11/351,342.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Fukuda, et al., "SOI CMOS Device Technology", Special Edition on 21st Century Solutions, 2001, pp. 54-57.
Fukuda, et al., "SOI CMOS Device Technology", OKI Technical Review, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "SPICE Modeling of Microwave and RF Control Diodes", IEEE, 2000, pp. 28-31.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Karandikar, et al., "Technology Mapping for SOI Domino Logic Incorporating Solutions for the Parasitic Bipolar Effect", ACM, 2001, pp. 1-14.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.

Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Dribinsky, Response file in USPTO date Aug. 28, 2009 to related U.S. Appl. No. 11/881,816.
Matloubian, "Smart Body Contact for SOI MOSFETs", 1989 IEEE SOS/SOI Technology Conference, Oct. 1999, pp. 128-129.
Chuang, et al., "SOI for Digital CMOS VLSI Design: Design Consideration and Advances", Proceedings of the IEEE, vol. 86, No. 4, Apr. 1998, pp. 689-720.
Chung, et al., "SOI MOSFET Structure with a Junction Type Body Contact for Suppression of Pass Gate Leakage", IEEE Transactions on Elelctron Devices, vol. 48, No. 7, Jul. 2001.
Rozeau, et al., "SOI Technologies Overview for Low-Power Low-Voltage Radio-Frequency Aplications", Analog Integrated Circuits and Signal Processing, 25, Kluwer Academic Publishers, Nov. 2000, pp. 93-114.
Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.
Kuang, et al., "SRAM Bitline Circuits on PD SOI: Advantages and Concerns", IEEE Journal of Solid-State Circuits, vol. 32, No. 6, Jul. 1997.
Maeda, et al., "Substrate-Bias Effect and Source-Drain Breakdown Characteristics in Body-Tied Short-Channel SOI MOSFET's", IEEE Transactions on Electron Devices, vol. 46, No. 1, Jan. 1999, pp. 151-158.
Morena, Supplementary European Search Report dated Feb. 17, 2010 relating to appln. No. 06814836.0.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State Circuits Conference, Feb. 1997.
Sleight, et al., "Transient Measurements of SOI Body Contact Effectiveness", IEEE Electron Device Letters, vol. 19, No. 12, Dec. 1998.
Assaderaghi, et al, "Transient Pass-Transistor Leakage Current in SOI MOSFET's", IEEE Electron Device Letters, vol. 18, No. 6, Jun. 1997, pp. 241-243.
Brindle, et al., Translation of a response filed with the Chinese Patent Office dated Nov. 30, 2009 relating to appln. No. 200680025128.7.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (P-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.

(56) References Cited

OTHER PUBLICATIONS

Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", 1996 IEEE Int'l Solid-State Circuits Conference, Feb. 1996, pp. 88-89,424.
Brindle, et al., Response filed in the EPO for related appln. No. 06814836.0-1235 dated Oct. 12, 2010.
Numata, et al., "A +2.4/0 V Controlled High Power GaAs SPDT Antenna Switch IC for GSM Application", IEEE Radio Frequency Integrated Circuits Symposium, 2002, pp. 141-144.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp, 173-176.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
Huang, et al., "A 0.5-um CMOS T/R Switch for 900-MHz Wireless Applications", IEEE Journal of Solid-State Circuits, 2001, pp. 486-492.
Yamamoto, et al., "A Single-Chip GaAs RF Transceiver for 1.9GHz Digital Mobile Communication Systems", IEEE Journal of Solid-State Circuits, 1996.
Yamamoto, et al., "A Single-Chip GaAs RF Transceiver for 1.9GHz Digital Mobile Communication Systems", IEEE, 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.
Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al "Cascode Voltage Switch Logic: A Different CMOS Logic Family", IEEE International Solid-State Circuits Conference, 1984, pp. 16-17.

(56) References Cited

OTHER PUBLICATIONS

Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"Cmos SOI RF Switch Family", Honeywell, 2002, pp. 1-4.
"CMOS SOI Technology", Honeywell, 2001, pp. 1-7.
Burgener, "CMOS SOS Switches Offer Useful Features, High Integration", Microwaves & RF, 2001, pp. 107-118.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Burgener, et al., Comments on Examiners Statements of Reasons for Allowance filed in the USPTO dated Aug. 2004 relating to U.S. Appl. No. 10/267,531.
Aquilani, Communication and supplementary European Search Report dated Nov. 2009 relating to appln. No. 05763216.
Van Der Peet, Communications pursuant to Article 94(3) EPC received from the EPO dated Jun. 2008 relating to appln. No. 02800982.7-2220.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IEEE, 2000, pp. 6.4.1-6.4.4.
Uda, et al., "A High Performance and Miniturized Dual Use (antenna/local) GaAs SPDT Switch IC Operating at +3V/0V", Microwave Symposium Digest, 1996, pp. 141-144.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver, Microwave and Millimeter-Wave Monolithic Circuits Symposium", 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Shimura, et al., "High Isolation V-Band SPDT Switch MMIC for High Power Use, IEEE MTT-S International Microwave Symposium Digest", 2001, pp. 245-248.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al., "Effect of Body Structure on Analog Performance of SOI NMOSFETs", 1998 IEEE International SOI Conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
"Positive Bias GaAs Multi-Throw Switches with Integrated TTL Decoders", Hittite Microwave, 2000.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Koh, et al., "Low-Voltage SOI CMOS VLSI Devices and Circuits", Wiley Interscience, XP001090589, New York, 2001, pp. 57-60, 349-354.

(56) References Cited

OTHER PUBLICATIONS

Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AIGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
De La Houssaye, et al., "Microwave Performance of Optically Fabricated T-Gate Thin Film Silicon on Sapphire Based MOSFET's", IEEE Electron Device Letters, 1995, pp. 289-292.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
McGrath, et al., "Novel High Performance SPDT Power Switches Using Multi-Gate FET's", IEEE, 1991, pp. 839-842.
Tieu, Notice of Allowance and Fee(s) Due from the USPTO dated Jun. 2006 relating to U.S. Appl. No. 10/922,135.
Tieu, Office Action from the USPTO dated Sep. 2009 relating to U.S. Appl. No. 11/347,014.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits, IEEE Transactions on Microwave Theory and Techniques", 2000, pp. 98-103.
"Radiation Hardened CMOS Dual DPST Analog Switch", Intersil, 1999, pp. 1-2.
Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
Tieu, Office Action from the USPTO dated Nov. 2007 relating to U.S. Appl. No. 11/582,206.
Tieu, Office Action from the USPTO dated Jun. 2005 relating to U.S. Appl. No. 10/922,135.
Tieu, Notice of Allowance from the USPTO dated Jun. 2006 relating to U.S. Appl. No. 10/922,135.
Chow, Office Action from the USPTO dated Apr. 2010 relating to U.S. Appl. No. 11/347,671.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Kelly, et al., Proposed Amendment After Final filed in the USPTO dated Jun. 8, 2009 for U.S. Appl. No. 11/351,342, 11 pgs.
Pozar, "Microwave and RF Design of Wireless Systems", Wiley, 2001.
Maas, "The RF and Microwave Circuit Design Cookbook", Artech House, 1998.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Fuse, et al., "A 0.5V 200MHz 1-Stage 32b ALU Using a Body Bias Controlled SOI Pass-Gate Logic", IEEE Int'l Solid-State Circuits Conference, Feb. 1997.
Douseki, et al., "A 0.5-V MTCMOS/SIMOX Logic Gate", IEEE Journal of Solid-State Circuits, vol. 32, No. 10, Oct. 1997.
Douseki, et al., "A 0.5v SIMOX-MTMCOS Circuit with 200ps Logic Gate", IEEE Int'l Solid-State Circuits Conference, 1996, pp. 84-85, 423.
Shimomura, et al., "A 1-V 46-ns. 16-mb SOI-DRAM with Body Control Technique", IEEE Journal of Solid-State Circuits, vol. 32, No. 11, Nov. 1997, pp. 1712-1720.
Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.
Workman, et al., "A Comparative Analysis of the Dynamic Behavior of BTG/SOI MOSFETs and Circuits with Distributed Body Resistance", IEEE Transactions on Electron Devices, vol. 45, No. 10, Oct. 1998, pp. 2138-2145.
Kuang, et al., "A Dynamic Body Discharge Technique for SOI Circuit Applications", IEEE Int'l SOI Conference, Oct. 1999, pp. 77-78.
Assaderaghi, et al., "A Dynamic Threshold Voltage MOSFET (DTMOS) for Ultra-Low Voltage Operation", Int'l Electron Devices Meeting, Dec. 1994, pp. 809-812.
Kuang, et al., "A Floating-Body Charge Monitoring Technique for Partially Depleted SOI Technology", Int'l Journal of Electronics, vol. 91, No. 11, Nov. 2004, pp. 625-637.
Gil, et al., "A High Speed and Low Power SOI Inverter Using Active Body-Bias", Proceedings Int'l Symposium on Low Power Electronics and Design, Aug. 1998, pp. 59-63.
Gil, et al., "A High Speed and Low Power SOI Inverter Using Active Body-Bias", Solid-State Electronics, vol. 43, 1999, pp. 791-799.
Kuang, et al., "A High-Performance Body-Charge-Modulated SOI Sense Amplifier", IEEE Int'l SOI Conference, Oct. 2000, pp. 100-101.
Tinella, et al. "A High-Performance CMOS-SOI Antenna Switch for the 2.5 5GHz Band", IEEE Journal of Solid-State Circuits, vol. 38, No. 7, Jul. 2003, All pgs.
Chung, et al., "A New SOI Inverter for Low Power Applications", IEEE SOI Conference, Oct. 1996, pp. 20-21.
Chung, et al., "A New SOI Inverter Using Dynamic Threshold for Low-Power Applications", IEEE Electron Device Letters, vol. 18, No. 6, Jun. 1997, pp. 248-250.
Chung, et al., "A New SOI MOSFET Structure with Junction Type Body Contact", Int'l Electron Device Meeting (IEDM) Technical Digest, 1999, pp. 59-62.
Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.
Wang, et all., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Tech-

(56) References Cited

OTHER PUBLICATIONS nique", Proceedings of the 43rd IEEE Midwest Symposium on Circuits and Systems, Aug. 2000, pp. 694-697.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.

Kanda, et al., "A SI RF Switch MMIC for the Cellular Frequency Band Using SOI-CMOS Technology", Institute of Electronics, Information and Communication Engineers Technical Report, vol. 100, No. 152, Jun. 2000, pp. 79-83.

Hu, et al., "A Unified Gate Oxide Reliability Model", IEEE 37th Annual Int'l Reliability Physics Symposium, 1999, pp. 47-51, San Diego, California.

Nakatani, "A Wide Dynamic Range Switched-LNA in SiGe BICMOS", IEEE Radio Frequency Integrated Circuits Symposium, 2001, pp. 223-226.

Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pgs. All.

Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.

Wada, et al., "Active Body-Bias SOI-CMOS Driver Circuits", Symposium on VLSI Circuits Digest of Technical Papers, 1997, pp. 29-30.

Stuber, et al., Amendment filed in the USPTO dated Jun. 10, 2010 for related U.S. Appl. No. 11/520,912, 28 pgs.

Saccamango, et al., "An SOI Floating Body Charge Monitor Technique", IEEE Int'l SOI Conference, Oct. 2000, pp. 88-89.

Lee, et al., "Analysis of Body Bias Effect with PD-SOI or Analog and RF Applications", Solid State Electron, vol. 46, 2002, pp. 1169-1176.

Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.

Gautier, et al., "Body Charge Related Transient Effects in Floating Body SOI NMOSFETs", IEDM Tech. Digest, 1995, pp. 623-626.

Koh, et al., "Body-Contracted SOI MOSFET Structure and its Application to DRAM", IEEE Transactions on Electron Devices, vol. 45, No. 5, May 1998, pp. 1063-1070.

Koh, et al., "Body-Contacted SOI MOSFET Structure with Fully Bulk CMOS Compatible Layout and Process", IEEE Electron Device Letters, vol. 18, No. 3, Mar. 1997, pp. 102-104.

Tseng, et al., "Characterization of Floating Body and Body-Grounded Thin Film Silicon-on-Insulator MOSFETs for Analog Circuit Applications", Ph.D. Thesis, UCLA, 1999, pgs. All.

Madihian, et al., "CMOS RF ICs for 900MHz-2.4GHz Band Wireless Communication Networks", IEEE Radio Frequency Integrated Circuits Symposium, 1999, pp. 13-16.

Orndorff, et al., "CMOS/SOS/LSI Switching Regulator Control Device", IEEE Int'l Solid-State Circuits Conference, ISSCC 78, Feb. 1978, pp. 234-235, 282.

Eschenbach, Communication from the EPO dated Feb. 4, 2009 for related appln. No. 06786943.8, 101 pgs.

Shingleton, Communication from the USPTO dated Apr. 28, 2009 for related appln. No. 11/881,816, 3 pgs.

Le, Dinh Thanh, Office Action received from the USPTO dated Jun. 23, 2011 for related U.S. Appl. No. 12/803,064, 16 pgs.

Brosa, Anna-Maria, extended European Search Report received from the EPO dated Jul. 15, 2011 for related application No. 09715932.1, 12 pgs.

Le, Dinh, Office Action from the USPTO dated Dec. 1, 2011 for related U.S. Appl. No. 12/803,064, 23 pgs.

Patel, Reema, Office Action from the USPTO dated Dec. 5, 2011 for related U.S. Appl. No. 13/046,560, 13 pgs.

Dang, Hung, Office Action from the USPTO dated Dec. 22, 2011 for related U.S. Appl. No. 12/735,954, 32 pgs Peregrine Semiconductor Corporation, Response filed in the EPO dated Feb. 10, 2012 or related application No. 09715932.1, 47 pgs.

Cole, Brandon S., Office Action received from the USPTO dated Feb. 24, 2012 for related U.S. Appl. No. 12/803,133. 36 pgs.

Englekirk, Robert Mark, Amendment filed in the USPTO dated Mar. 5, 2012 for related U.S. Appl. No. 13/046,560, 4 pgs.

Ranta, Tero Tapio, Amendment filed in the USTPO dated Mar. 21, 2012 for related U.S. Appl. No. 12/735,954, 16 pgs.

Ranta, et al., Amendment filed in the USPTO dated Apr. 30, 2012 for related U.S. Appl. No. 12/803,064, 16 pgs.

Kurisu, Masakazu, Office Action and translation received from the Japanese Patent Office dated Apr. 17, 2012 for related appln. No. 2010-506156, 4 pgs.

Ranta, et al., Response filed in the USPTO dated May 23, 2012 for related U.S. Appl. No. 12/803,133, 7 pgs.

Patel, Reema, Notice of Allowance received from the USPTO dated May 24, 2012 for related U.S. Appl. No. 13/046,560, 15 pgs.

Cole, Brandon S., Notice of Allowance received from the USPTO dated Jun. 8, 2012 for related U.S. Appl. No. 13/803,133, 12 pgs.

Le, Dinh Thanh, Office Action received from the USPTO dated Jun. 13, 2012 for related U.S. Appl. No. 12/803,064, 14 pgs.

Dang, Hung Q., Notice of Allowance received from the USPTO dated Jul. 12, 2012 for related U.S. Appl. No. 12/735,954, 20 pgs.

Theunissen, Lars, Communication under Rule 71(3) EPC received from the EPO dated Jul. 2, 2012 for related appln. No. 09715932.1, 98 pgs.

Ranta, et al., Comments on Examiner's Statement of Reasons for Allowance received from the USPTO dated Sep. 10, 2012 for related U.S. Appl. No. 12/803,133, 3 pgs.

Ranta, et al., Amendment filed in the USPTO dated Sep. 12, 2012 for related U.S. Appl. No. 12/803,064, 13 pgs.

Dang, Hung Q., Office Action received from the USPTO dated Feb. 26, 2014 for U.S. Appl. No. 12/735,954, 34 pgs.

Gonzalez, Brosa, Decision to Grant a European patent pursuant to Article 97(1) EPC received from the EPO dated Apr. 17, 2014 for appln. No. 12194187.6, 1 pg.

Peregrine Semiconductor Corporation, Response and English translation filed in the JPO dated Apr. 28, 2014 for appln. No. 2013-006353, 22 pgs.

European Patent Office, Noting of Loss of Rights pursuant to Rule 112(1) EPC received from the EPO dated May 2, 2014 for appln. No. 07794407.2, 1 pg.

Brosa, Anna-Maria, Extended Search Report received from the EPO dated May 27, 2014 for appln. No. 14165804/7, 8 pgs.

Ranta, Tero Tapio, Amendment filed in the USPTO dated Jun. 16, 2014 for U.S. Appl. No. 12/735,954, 33 pgs.

Peregrine Semiconductor Corporation, Response filed in the EPO dated Jul. 11, 2014 for appln. No. 07794407.2, 32 pgs.

European Patent Office, Communication pursuant to Rule 58 EPC received from the EPO dated Jul. 21, 2014 for appln. No. 07794407.2, 5 pgs.

Peregrine Semiconductor Corporation, Response filed in the EPO dated Jul. 31, 2014 for appln. No. 07794407.2, 25 pgs.

Patel, Reema, Office Action received from the USPTO dated Aug. 15, 2014 for U.S. Appl. No. 14/028,357, 8 pgs.

Wong, Alan, Office Action received from the USPTO dated Sep. 12, 2014 for U.S. Appl. No. 13/595,893, 11 pgs.

Dang, Hung Q., Notice of Allowance received from the USPTO dated Nov. 18, 2014 for U.S. Appl. No. 12/735,954, 33 pgs.

Ichikawa, Takenori, Office Action and English translation received from the JPO dated Nov. 18, 2014 for appln. No. 2013-181032, 7 pgs.

Wong, Alan, Notice of Allowance received from the USPTO dated Nov. 21, 2014 for U.S. Appl. No. 13/586,738, 205 pgs.

Peregrine Semiconductor Corporation, Response filed in the EPO dated Dec. 10, 2014 for appln. no. 14165804/7, 76 pgs.

Reedy, et al., Response filed in the USPTO dated Dec. 12, 2014 for U.S. Appl. No. 13/595,893, 24 pgs.

Englekirk, Robert Mark, Response filed in the USPTO dated Dec. 15, 2014 for U.S. Appl. No. 14/028,357, 10 pgs.

(56) References Cited

OTHER PUBLICATIONS

Bawell, et al., Comments on Examiner's Statement of Reasons for Allowance filed in the USPTO dated Feb. 23, 2015 for U.S. Appl. No. 13/586,738, 3 pgs.
Wong, Alan, Final Office Action received from the USPTO dated Mar. 4, 2015 for U.S. Appl. No. 13/595,893, 33 pgs.
Dang, Hung Q., Notice of Allowance received from USPTO dated Oct. 1, 2012 for related U.S. Appl. No. 12/735,954, 67 pgs.
Le, Dinh Thanh, Office Action received from USPTO dated Nov. 20, 2012 for related U.S. Appl. No. 12/803,064, 6 pgs.
Patel, Reema, Notice of Allowance received from USPTO dated Dec. 3, 2012 for related U.S. Appl. No. 13/046,560, 9 pgs.
Ranta, et al., Response filed in USPTO on Jan. 22, 2013 for related U.S. Appl. No. 12/803,064, 7 pgs.
Dang, Hung Q., Notice of Allowance received from USPTO dated Jan. 25, 2013 for related U.S. Appl. No. 12/735,954, 42 pgs.
Ranta, et al., Second Response After Final filed in USPTO Feb. 20, 2013 for related U.S. Appl. No. 12/803,064, 9 pgs.
Brosa, Anna-Maria, European Search Report received from EPO on Feb. 1, 2013 for related appln. No. EP12194187, 10 pgs.
Le, Dinh Thanh, Notice of Allowance received from USPTO dated Mar. 4, 2013 for related U.S. Appl. No. 12/803,064, 6 pgs.
Patel, Reema, Notice of Allowance received from USPTO dated Mar. 15, 2013 for related U.S. Appl. No. 13/046,560, 10 pgs.
Dang, Hung Q., Notice of Allowance received from USPTO dated May 5, 2013 for related U.S. Appl. No. 12/735,954, 22 pgs.
Peregrine Semiconductor Corporation, Response filed in EPO dated May 23, 2013 for related appln. No. 09174085.2, 16 pgs., (PER-019-EPO-2).
Englekirk, Robert, Issue Fee Transmittal and Comments on Examiner's Statement of Reasons for Allowance filed in USPTO on Jun. 17, 2013 for related U.S. Appl. No. 13/046,560, 4 pgs.
Gonzalez, Brosa, Decision to Grant a European patent pursuant to Article 97(1)EPC received from the EPO dated Nov. 2, 2012 for related appln. No. 09715932.1, 1 pg.
Volker, Simon, Communication Pursuant to Article 94(3) EPC received from the EPO dated Nov. 16, 2012 for related appln. No. 09174085.2, 8 pgs.
Japanese Patent Office, Notice of Allowance received from the JPO dated Dec. 17, 2012 for related appln No. 2010-506156, 3 pgs.
Utagawa, Tsutomu, English translation of Notification of Reasons for Refusal received from the JPO dated Jun. 4, 2013 for related appln. No. 2010-548750, 3 pgs.
Le, Dinh Thanh, Notice of Allowance received from USPTO dated Jul. 18, 2013 for related U.S. Appl. No. 12/803,064, 12 pgs.
Cole, Brandon S., Notice of Allowance received from USPTO dated Jul. 30, 2013 for related U.S. Appl. No. 12/803,133, 136 pgs.
Burgener, et al. Amendment filed in the USPTO dated Aug. 19, 2013 for related U.S. Appl. No. 12/980,161, 20 pgs.
Peregrine Semiconductor Corporation, Response and English translation filed in JPO dated Sep. 4, 2013 for related appln. No. 2010-548750, 11 pgs.
Dang, Hung, Notice of Allowance received from the USPTO dated Sep. 13, 2013 for related U.S. Appl. No. 12/735,954, 16 pgs.
Volker, Simon, Communication pursuant to Article 94(3) EPC received from the EPO dated Sep. 24, 2013 for related appln. No. 07794407.2-1805, 5 pgs.
Funakoshi, Ryo, Office Action and English translation received from the JPO dated Oct. 29, 2013 for related appln. No. 2013-006353, 15 pgs.
Theunissen, Lars, Communication under Rule 71(3) EPC received from the EPO dated Nov. 12, 2013 for related appln. No. 12194187.6, 94 pgs.
Peregrine Semiconductor Corporation, Response filed in the EPO dated Sep. 11, 2013 for related appln. No. 1219418.6, 16 pgs.
Rojas, Daniel E., Office Action received from the USPTO dated Feb. 21, 2013 for U.S. Appl. No. 12/803,139, 7 pgs.
Ranta, et al., Response filed in the USPTO dated May 20, 2013 for U.S. Appl. No. 12/803,139, 8 pgs.
Rojas, Daniel E., Office Action received from the USPTO dated Jun. 17, 2013 U.S. Appl. No. 12/803,139, 36 pgs.
Ranta, et al., Response filed in the USPTO dated May 20, 2013 for U.S. Appl. No. 12/803,139, 14 pgs.
Rojas, Daniel E., Notice of Alowance received from the USPTO dated Oct. 22, 2013 for U.S. Appl. No. 12/803,139, 142 pgs.
Patel, Reema, Final Office Action received from the USPTO dated Apr. 7, 2015 for U.S. Appl. No. 14/028,357, 159 pgs.
Englekirk, Robert Mark, Response After Final Office Action filed in the USPTO dated Jun. 8, 2015 for U.S. Appl. No. 14/028,357, 3 pgs.
Patel, Reema, Notice of Allowance received from the USPTO dated Jun. 25, 2015 for U.S. Appl. No. 14/028,357, 12 pgs.

* cited by examiner

DEVICES AND METHODS FOR IMPROVING VOLTAGE HANDLING AND/OR BI-DIRECTIONALITY OF STACKS OF ELEMENTS WHEN CONNECTED BETWEEN TERMINALS

CROSS REFERENCE TO RELATED APPLICATIONS

This application is a divisional of U.S. patent application Ser. No. 12/803,139 filed on Jun. 18, 2010, entitled "Devices and Methods for Improving Voltage Handling and/or Bi-Directionality of Stacks of Elements When Connected Between Terminals", which is incorporated herein by reference in its entirety and which is a continuation-in-part of PCT Patent Application No. PCT/US2009/001358 filed on Mar. 2, 2009, entitled "Method and Apparatus for use in Digitally Tuning a Capacitor in an Integrated Circuit Device" which claims the benefit under 35 U.S.C. §119 (c) of U.S. Provisional Application No. 61/067,634, filed Feb. 28, 2008, entitled "Method and Apparatus for Digitally Tuning a Capacitor in an Integrated Circuit Device," both the PCT Application No. PCT/US2009/001358 and Provisional Application No. 61/067,634 are incorporated herein by reference as if set forth in full; this application is also related to U.S. patent application Ser. No. 12/803,064, filed on Jun. 18, 2010, and U.S. patent application Ser. No. 12/803,133, filed on Jun. 18, 2010, now U.S. Pat. No. 8,604,864, issued on Dec. 10, 2013, both entitled "Devices And Methods For Improving Voltage Handling And/Or Bi-Directionality Of Stacks Of Elements When Connected Between Terminals"; both of the related applications are also incorporated herein by reference as if set forth in full.

BACKGROUND

Field

The present disclosure relates to devices and methods for improving voltage handling and/or bi-directionality of stacks of elements when connected between terminals.

SUMMARY

According to a first aspect, a unit cell for a sub-circuit of a digitally tunable capacitor (DTC) is provided, the sub-circuit being adapted to be coupled between a first RF terminal and a second RF terminal, the unit cell comprising: a plurality of stacked switches, the stacked switches proceeding from a first switch closest to the first RF terminal and farthest from the second RF terminal to an n-th switch farthest from the first RF terminal and closest to the second RF terminal, wherein: the first RF terminal is a terminal through which a voltage source is adapted to be coupled to the unit cell; the stacked switches comprise a first set of switches close to the first RF terminal and far from the second RF terminal and a second set of switches far from the first RF terminal and close to the second RF terminal, each switch of the first set and second set being coupled in parallel with a compensating capacitor thus providing a compensated capacitance value for that switch when the switch is in an off state, and each switch of the first set has a corresponding switch of the second set having the same compensated capacitance value.

According to a second aspect, a circuit coupled between a first terminal and a second terminal is provided, comprising: a plurality of stacked switches, the stacked switches proceeding from a first switch closest the first terminal and farthest from the second terminal to an n-th switch farthest from the first terminal and closest to the second terminal, wherein: the first terminal is a terminal through which a voltage source is adapted to be coupled to the circuit; the stacked switches comprise a first set of switches close to the first terminal and far from the second terminal and a second set of switches far from the first terminal and close to the second terminal, each switch of the first set and second set being coupled in parallel with a compensating capacitor thus providing a compensated capacitance value for that switch when the switch is in an off state, and each switch of the first set has a corresponding switch of the second set having the same compensated capacitance value.

According to a third aspect, a circuit coupled between a first terminal and a second terminal is provided, comprising: a plurality of stacked elements, the stacked elements proceeding from a first element closest the first terminal and farthest from the second terminal to an n-th element farthest from the first terminal and closest to the second terminal, wherein: nodes between the elements exhibit parasitic capacitances, the first terminal is a terminal through which a voltage source is coupled to the circuit; the stacked elements comprise a first set of elements close to the first terminal and far from the second terminal and a second set of elements far from the first terminal and close to the second terminal, each element of the first set and second set being coupled in parallel with a compensating capacitor, and each element of the first set has a corresponding element of the second set having the same compensating capacitor value.

According to a fourth aspect, a circuit coupled between a first RF terminal and a second RF terminal is provided, comprising: a plurality of stacked elements, the stacked elements proceeding from a first element closest the first RF terminal and farthest from the second RF terminal to an n-th element farthest from the first RF terminal and closest to the second RF terminal, wherein: nodes between the elements exhibit parasitic capacitances, and the first RF terminal is a terminal through which a voltage source is coupled to the circuit, the circuit further comprising one or more compensation capacitors to compensate the parasitic capacitances, wherein combination between the stacked elements and the compensation capacitors provides a symmetrically compensated plurality of stacked elements with reference to a central node between the elements.

According to a fifth aspect, a circuit coupled between a first terminal and a second terminal is provided, comprising: a plurality of stacked elements, the stacked elements proceeding from a first element closest the first terminal and farthest from the second terminal to an n-th element farthest from the first terminal and closest to the second terminal, a plurality of compensating capacitors associated with the stacked elements, wherein: nodes between the elements exhibit parasitic capacitances, the first terminal is a terminal through which a voltage source is coupled to the circuit; the stacked elements comprise a first set of elements close to the first terminal and far from the second terminal and a second set of elements far from the first terminal and close to the second terminal, the compensating capacitors comprise a first set of compensating capacitors associated with the first set of elements and a second set of compensating capacitors associated with the second set of elements, the first set of compensating capacitors comprises i capacitors (i=1, 2, . . . ), the first capacitor of the first set of capacitors being located in parallel with a first element of the first set of elements, the second capacitor of the first set of capacitors being located in parallel with a series of the first element and a second element of the first set of elements, the third capacitor of the first set of capacitors being located in parallel with a series of the first element, the second element and a third element of the first set of elements and so on, and the second set of compensating capacitors comprises i corresponding capacitors (i=1, 2, . . . ), the first capacitor of the second set of capacitors being located in parallel with a first element of the second set of elements, the second capacitor of the second set of capacitors being located in parallel with a series of the first element and a second element of the second set of elements, the third capacitor of the second set of capacitors being located in parallel with a series of the first element, the second element and a third element of the second set of elements and so on.

According to a sixth aspect, a circuit coupled between a first terminal and a second terminal is provided, comprising: a plurality of stacked switches, the stacked switches proceeding from a first switch closest the first terminal and farthest from the second terminal to an n-th switch farthest from the first terminal and closest to the second terminal, a plurality of compensating capacitors associated with the stacked switches, wherein: nodes between the switches exhibit parasitic capacitances, the first terminal is a terminal through which a voltage source is adapted to be coupled to the circuit; the stacked switches comprise a first set of switches close to the first terminal and far from the second terminal and a second set of switches far from the first terminal and close to the second terminal, the compensating capacitors comprise a first set of compensating capacitors associated with the first set of switches, the first set of compensating capacitors comprises i capacitors (i=1, 2, . . . ), the first capacitor of the first set of capacitors being located in parallel with a first switch of the first set of switches, the second capacitor of the first set of capacitors being located in parallel with a series of the first switch and a second switch of the first set of switches, the third capacitor of the first set of capacitors being located in parallel with a series of the first switch, the second switch and a third switch of the first set of switches and so on.

According to a seventh aspect, a unit cell for a sub-circuit of a digitally tunable capacitor (DTC) is provided, the sub-circuit being adapted to be coupled between a first RF terminal and a second RF terminal, the unit cell comprising: a plurality of stacked switches coupled in series with one or more capacitors, the stacked switches proceeding from a first switch closest the first RF terminal and farthest from the second RF terminal to an n-th switch farthest from the first RF terminal and closest to the second RF terminal, wherein the one or more capacitors are placed symmetrically with respect to the plurality of stacked switches.

According to an eighth aspect, a voltage handling method is provided, comprising: providing a plurality of stacked switches, the stacked switches proceeding from a first switch closest to a first terminal and farthest from a second terminal to an n-th switch farthest from the first terminal and closest to the second terminal, the first terminal being a terminal through which a voltage source is coupled to the unit cell; and coupling the stacked switches in series with one or more capacitors, the one or more capacitors being placed symmetrically with respect to the plurality of stacked switches.

According to a ninth aspect, a method for compensating parasitic capacitances is provided, comprising: providing a plurality of stacked switches, the stacked switches proceeding from a first switch closest to a first terminal and farthest from a second terminal to an n-th switch farthest from the first terminal and closest to the second terminal, the first terminal being a terminal through which a voltage source is adapted to be coupled to the stacked switches; and sizing the stacked switches so that the first switch has the same size of the n-th switch.

According to a tenth aspect, a stacked device is provided, comprising: a plurality of stacked switches, the stacked switches proceeding from a first switch closest to a first terminal and farthest from a second terminal to an n-th switch farthest from the first terminal and closest to the second terminal, the first terminal being a terminal through which a voltage source is adapted to be coupled to the stacked switches, the stacked switches being sized such that the first and the n-th switch have the same size.

Further embodiments of the disclosure are provided in the specification, claims and drawings of the present application.

DETAILED DESCRIPTION

Figure 1:
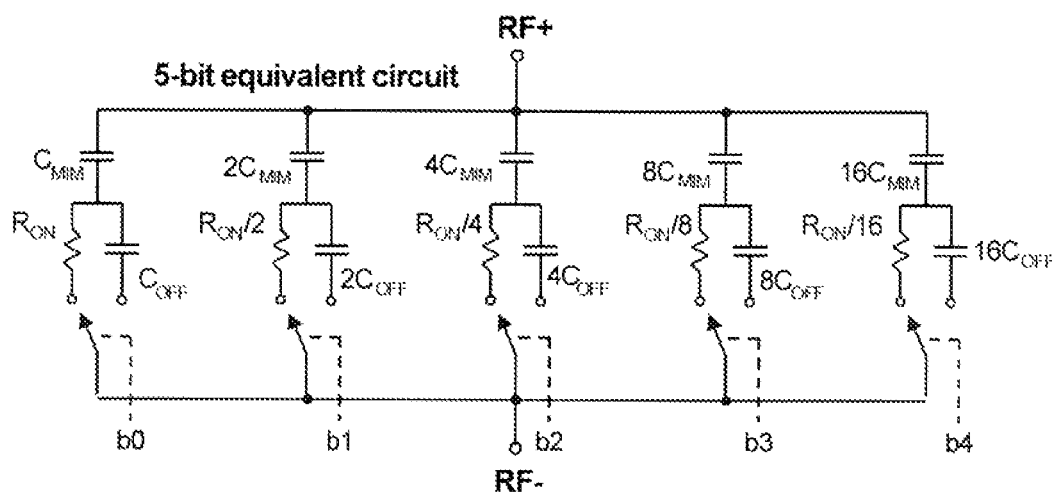
FIG. 1 shows an equivalent circuit with ON resistances and OFF capacitances of a digitally tunable capacitor (DTC) circuit.

FIG. 1 corresponds to FIG. 5D of PCT Patent Application No PCT/US2009/001358 incorporated herein by reference in its entirety. FIG. 1 is an equivalent circuit showing the ON resistances and OFF capacitances associated with switching FETs of a digitally tunable capacitor (DTC) circuit disclosed in PCT Patent Application PCT/US2009/001358.

Figure 2:
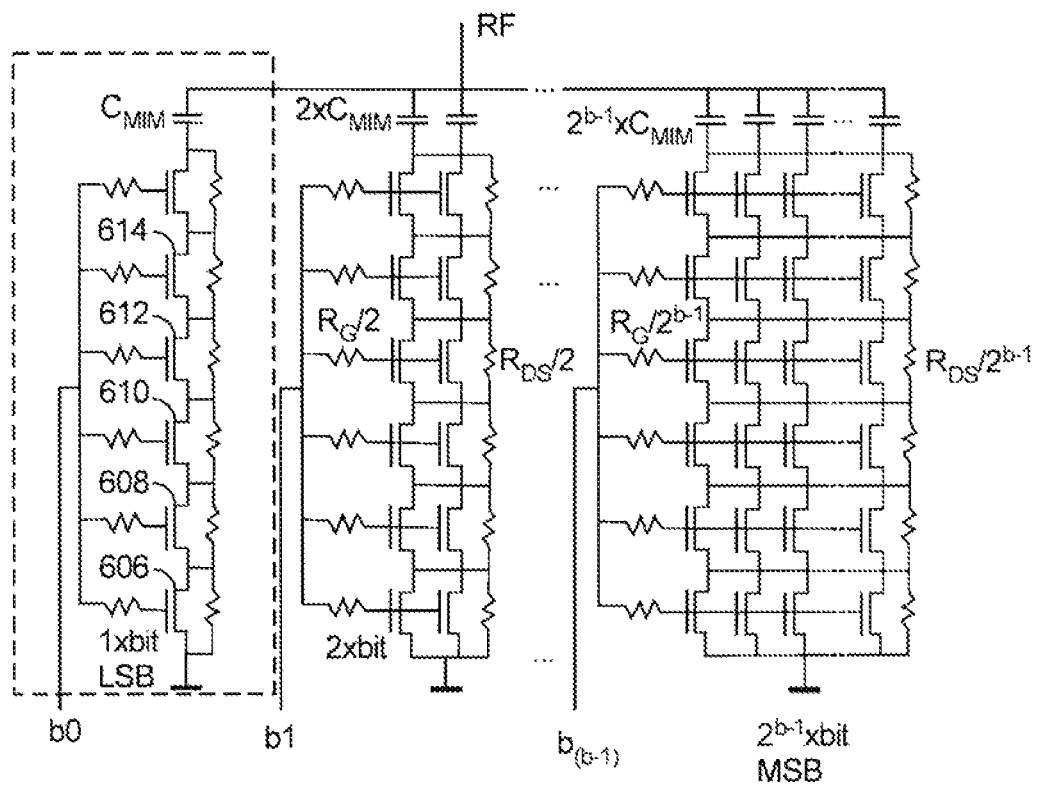
FIG. 2 shows a plurality of stacked FETs of a DTC circuit coupled in series.

FIG. 2 shows design details of an embodiment of a DTC where a plurality of stacking FETs are coupled in series with associated and corresponding metal-insulator-metal (MIM) or metal-metal (MM) capacitors.

Figure 3:
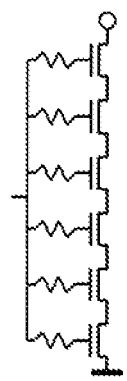
FIG. 3 shows a detail of the circuit of FIG. 2 without MIM capacitors.
Figure 4:
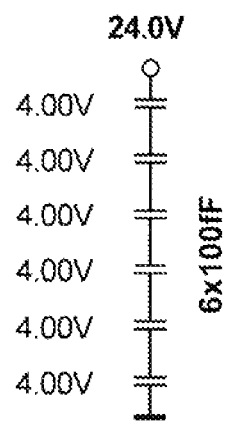
FIG. 4 shows an equivalent circuit of the circuit of FIG. 3 with OFF capacitances in an ideal condition, where the voltage difference is equally divided among the transistors.

FIG. 3 represents a detail of the circuit of FIG. 2 without MIM (or MM) capacitors, while FIG. 4 shows an equivalent circuit of the circuit of FIG. 3 where all FETs of the FET stack are OFF. Assuming that the voltage at the top of the stack is, for example, 24 V and the voltage at the bottom of the stack is, for example, ground, in an ideal condition the voltage difference is equally divided among the transistors. This ideal condition is represented in FIG. 4 by showing a voltage drop of 4 V across each OFF capacitance $C_{OFF}$. It should be noted that in the embodiment of FIG. 4 the voltages are the peak values of a sinusoidal signal. The stack height for this stack would be 6, because there are 6 devices in series. In this case, there is equal voltage division across the stack so in order to get the voltage across a device one would divide the source voltage by 6.

Figure 5:
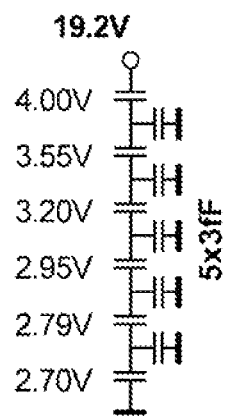
FIG. 5 shows a circuit where parasitic capacitances are present.

However, the presence of parasitic capacitances can be problematic. FIG. 5 shows a simplistic representation of such capacitances to ground, the presence of which does not allow an equal division of the voltage difference across the transistors, thus reducing the efficiency of the stack. A possible figure of merit for asymmetric voltage division is the effective stack height which is Vsource/Vmax. In this context Vmax is the voltage across the FET closest to the source when the given Vsource is applied. The effective stack height is the resulting stack height observed with the presence of parasitic and compensation within the stack. In this case the effective stack height would be 19.2V/4V=4.8 which is less than the ideal value of 6 assuming no parasitics. This means that in order to get the max voltage across a device one would divide the source voltage by 4.8.

Although the parasitic capacitances of FIG. 5 go to ground, the parasitic capacitances from the internal nodes can go to any number of places. In a standard CMOS they may go to the substrate. In an SOI or GaAs process they may go to the package or metal on the back of the part. Parasitic capacitances can also go to nearby metal lines which may also have signal content on them. However, they all include capacitance from an internal node to some other node and can be fairly modeled through the representation of FIG. 5.

Figure 6:
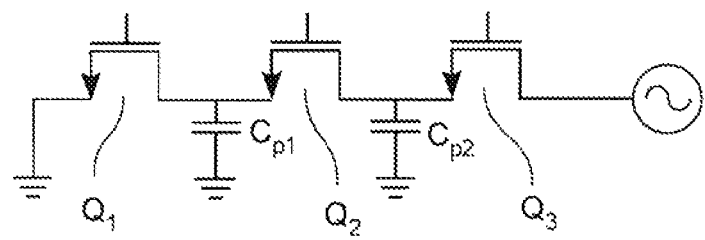
FIGS. 6 and 8 show stacks of three and sixteen transistors, respectively, with parasitic capacitances.
Figure 7:
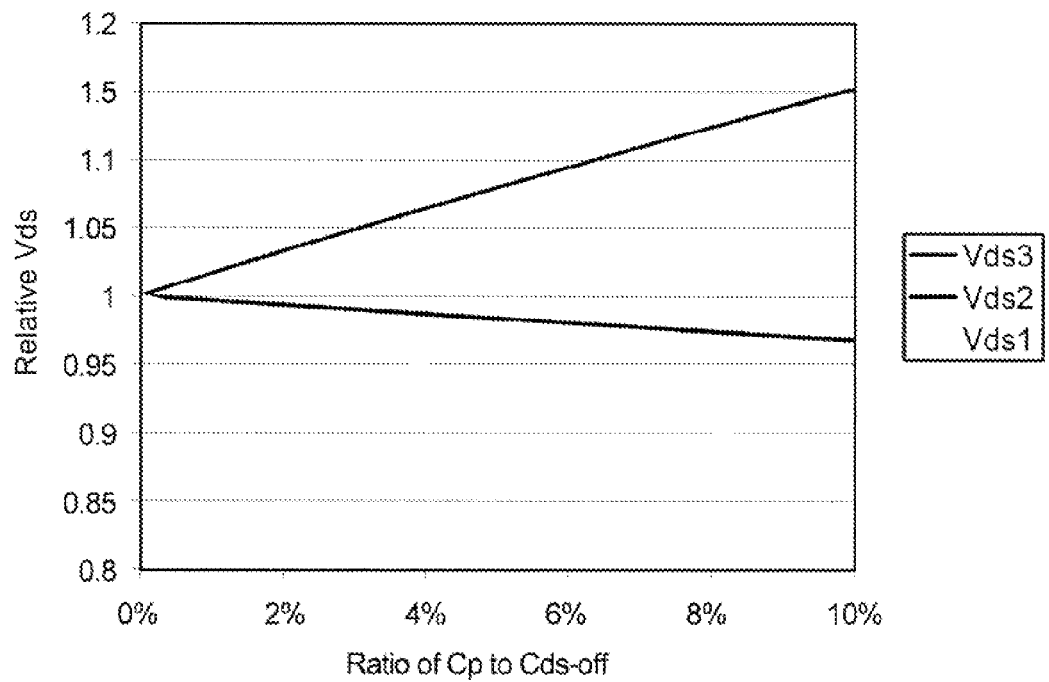
FIGS. 7, 9 and 10 are waveforms showing the reduced efficiencies of a stack of capacitors in presence of parasitic capacitances.
Figure 8:
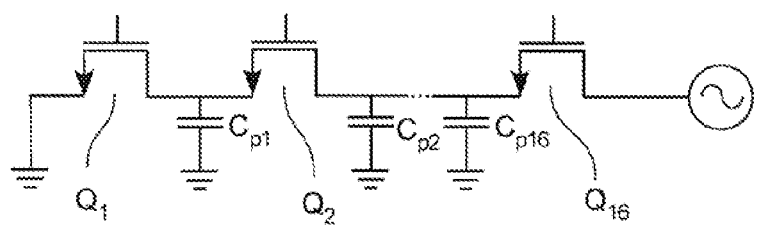
Figure 9:
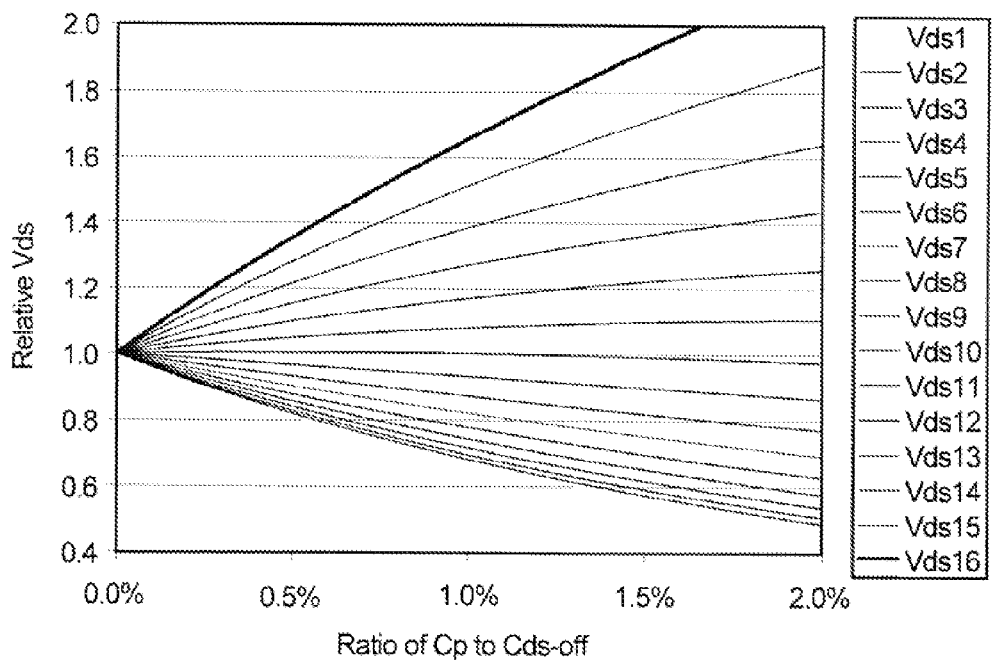
Figure 10:
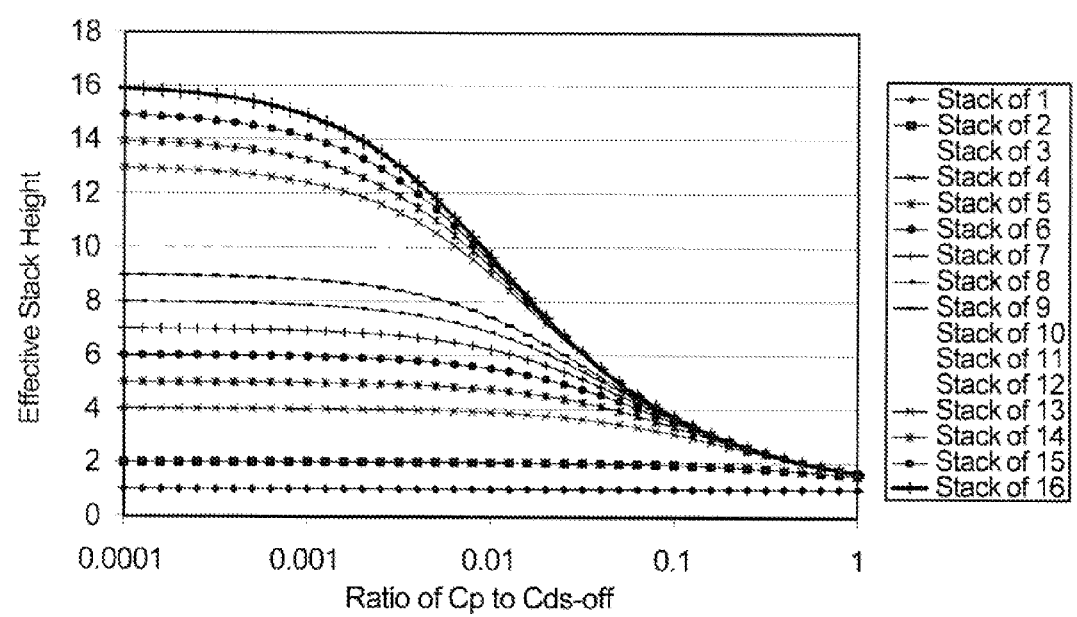

FIGS. 7 and 9 show relative Vds as a function of parasitic capacitance. Relative Vds is defined as the actual voltage across the FET in the presence of parasitics divided by the voltage across the FET if there were no parasitic. FIG. 10 shows the reduced efficiencies of a stack of capacitors in presence of parasitic capacitances. In particular, FIG. 7 refers to the stack of 3 transistors of FIG. 6, while FIGS. 9 and 10 refer to the stack of 16 transistors of FIG. 8.

FIG. 7 shows relative Vds of transistors as a function of a ratio of Cp to Cds-off in the exemplary stack of three transistors of FIG. 6. As Cp becomes appreciable in comparison to Cds-off, there is no longer equal voltage division in the stack (Relative Vds diverges from unity).

At larger stack heights (number S of transistors >>3), the relative Vds divergence from unity becomes worse. FIG. 9 shows what happens for the exemplary stack of 16 transistors of FIG. 8. Much smaller ratios of Cp to Cds-off can make very significant voltage asymmetries through the stack. For example, when Cp is just 1.6% of Cds-off there is twice as much voltage across transistor 16 as would be expected without parasitic capacitances. Thus, a stack of 16 transistors with parasitic capacitances is operating equivalent to a stack of 8 transistors without parasitic capacitances, but at the cost of four times more device area.

FIG. 10 shows the effect of parasitic capacitances on the efficiency of the stack of FIG. 8. With little or no parasitic capacitances compared to Cds-off, the stack operates as expected. As the ratio of the parasitic capacitance to Cds-off increases, the top transistor in the stack (i.e. the transistor nearest the voltage source) typically sees much more Vds than the rest of the transistors, and the transistors no longer equally share the source voltage. This reduces the stack efficiency. For a stack of 16, ideally the breakdown of the stack would be 16×BVds (where BVds is the breakdown voltage of the transistor), but at a Cp/Cds-off ratio of 1.6% (0.016), it will breakdown at 8×BVds as shown in FIG. 10. Thus, at a given ratio of parasitic capacitance Cp to Cds-off for a given process, there is a limit to the maximum stack height.

Embodiments of the present disclosure are directed at solving the above mentioned problems by adding compensation capacitors across the drain and source of at least the top FETs of the stack closest to the voltage source to decrease asymmetric voltage division.

Figure 11:
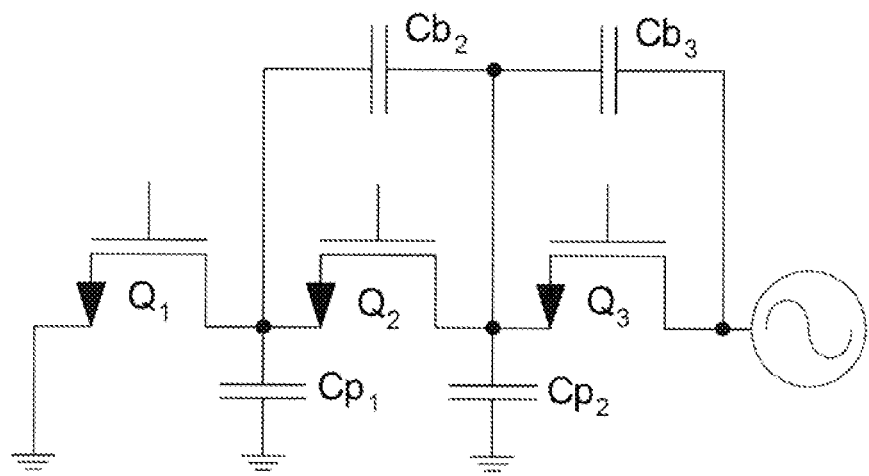
FIGS. 11-13 show embodiments where compensation capacitors are present.
Figure 12:
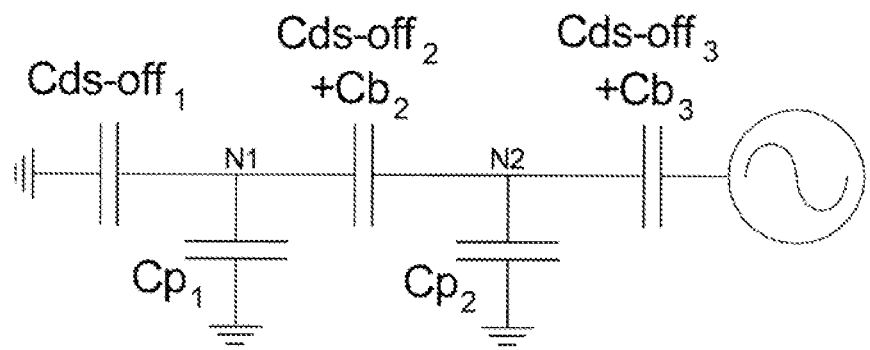

FIGS. 11 and 12 show a simplified model of a stack with three FETs (already shown in FIG. 6) which will be used for purposes of the calculation below, where Cb2 and Cb3 represent the compensation capacitors in accordance with the present disclosure.

In accordance with the embodiment of FIG. 11 and its equivalent of FIG. 12, for equal voltage division at node 1, $Cb_2$ would have to be equal $Cp_1$. As such, the capacitance looking left of node 2 would be $(Cds\text{-off}+Cp_1)/2$, assuming all Cds-off are the same. For proper voltage division at node 2, the total effective Cds of Q3 would have to be equal to twice that of $Cp_2$ and the capacitance to the left of it.

$Cds_3\text{-eff}=2\times((Cds\text{-off}+Cp_1)/2+Cp_2)=Cds\text{-off}+Cp_1+2Cp_2$ Thus, $Cb_3=Cp_1+2Cp_2$ For higher and higher stack heights it can be proven that the required additional capacitance across a given transistor Qn is:

$$Cb_n = \sum_{i=1}^{n-1} i \times Cp_1 \text{ for } n > 1, \text{ since } Cb_1 = 0$$

assuming that all transistors have the same Cds-off.

This shows that there is a geometric progression in additional capacitance required to fully compensate for the voltage asymmetry as the stack increases.

In larger stacks of devices, parasitic capacitances can go to any node in the stack or signal related nodes. Thus for example, node $N_1$ would have capacitance to $N_2$ called $Cp_{12}$, to $N_3$ called $Cp_{13}$, and so on. For purposes of the following calculations, it can be assumed that node $N_0$ is ground, and node $N_1$ is one transistor away from ground, and the higher the node number, the farther from ground. To properly compensate all of these capacitances on all nodes, the net charge induced on each node from all capacitors connected to that node should cancel. Since Q=CV=0 for node j:

$$0 = \sum_{i=0}^{P-1} (Vi - Vj) \times Cij$$

where:
P is the total number of capacitors on node j; and
Cij is the total capacitance between node i ($N_i$) and node j ($N_j$) which includes parasitic capacitance, compensation capacitance previously added on other nodes, and device Cds-off capacitance.

If it is further assumed that the only capacitances are to nodes in the device stack or ground, and that the voltage across the stack divides evenly (as desired), then the voltages all become integer relations.

$$0 = \sum_{i=0}^{S} (i - j) \times Cij$$

where S is the integer number of transistors in the stack.

Figure 13:
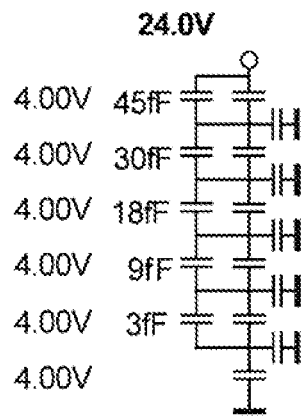

FIG. 13 shows an embodiment with a stack of six transistors, where compensation capacitors of 45, 30, 18, 9 and 3 fF are used. It should be noted that the effective stack height is back to its ideal value of 6.

In accordance with an embodiment of the present disclosure, assuming a stack of N transistors without MIM capacitors, N−1 capacitors can be used to achieve perfect symmetry. However, embodiments are also possible where less than N−1 capacitors are added, starting with the transistor closest to the voltage source (top capacitor of the stack in FIG. 5, or transistor Q3 in FIG. 11), to improve the effective stack height while not necessarily attaining equal voltage division.

Figure 40:
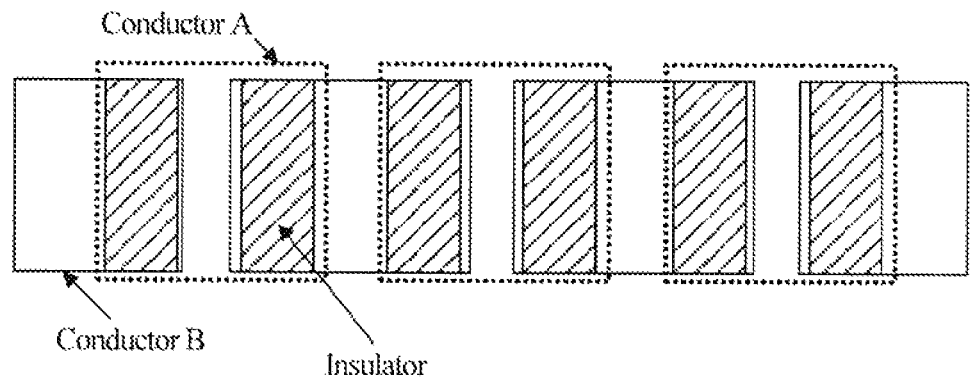
FIGS. 40 and 41 show an embodiment where size of the elements of the stack is varied.
Figure 41:
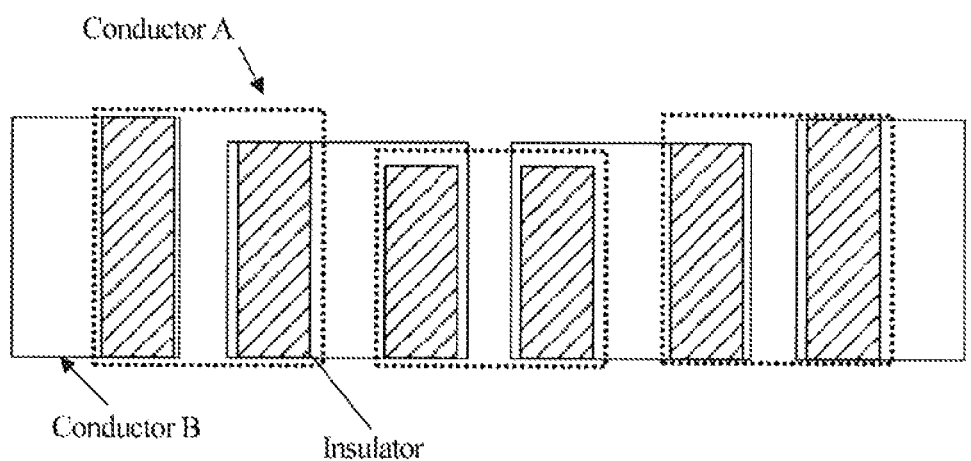

A further embodiment of the present disclosure is directed at compensation for parasitics by sizing the devices rather than adding compensation capacitance across the drain and source of the FETs. The Coff of a device is usually linearly related to the size of the device. By putting larger devices closer to the voltage source, the effects of parasitics can be reduced. Reference can be made, for example, to FIGS. 40 and 41. In particular, FIG. 41 shows how variation of the size of the devices can be obtained. Care should be taken in noting the increase in parasitics due to the increase of the size of the devices. Compensating this way has the benefit of not introducing the process variation of the compensation capacitors (such as MIM) which can be substantial and unrelated to FET Coff process variation. Embodiments of the present disclosure can be provided where the stacked switches are sized so that the first switch (the one closest to the terminal connected to the source) has the same size of the last switch (the one farthest from the terminal connected to the source). With reference to switch FETs, further embodiments can also be provided where also the second switch has the same size of the one before last, and so on. According to another embodiment, the sized first and n-th switches can be larger than the sized second and (n−1)-th switches, and so on.

Figure 14:
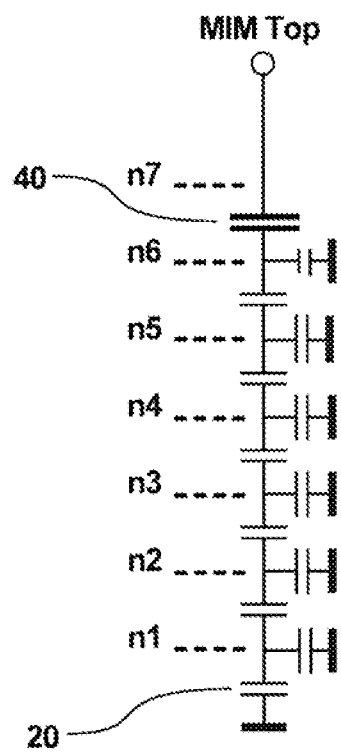
FIG. 14 shows a stack of OFF capacitances of a DTC with a MIM capacitor on top of the stack.

The above embodiments do not consider the presence of the MIM capacitors (10) of FIG. 1. Reference can be made to FIG. 14, which shows a representation of OFF capacitances (20) in a stacked configuration where parasitic capacitances (30) are present and where a MIM capacitor (40) is shown on top of the stack. In a digitally tuned capacitor, MIM capacitors are switched in and out of the circuit using the switch FETs. When the switch FETs are ON, the capacitance of the stack is determined by the MIM capacitor. When the switch FETs are OFF, the capacitance of the stack is reduced by presence of the OFF capacitance. Therefore, the MIM capacitors determine the upper limit of the capacitance tuning range.

The embodiment shown in FIG. 11 can be extended to the case of stacks with MIMs. In this case, the MIM will drop some of the voltage, reducing the voltage across the FETs. Compensation capacitance can still be added to the devices to achieve equal voltage division across the FETs only. As compensation capacitance is added to a FET, the effective Coff is increased reducing its impedance. It can be noted that adding compensation capacitance has little effect on the circuit performance when the FETs are on due to the relatively small values for Ron. In particular, compensation capacitors can be used on all devices and increased without bound hypothetically until the majority of the voltage is dropped across the MIM. The limit to the compensation capacitance value in stacks with MIMs is the maximum stack off-capacitance required which, neglecting parasitic and assuming constant $C_{off}$ across the stack is $C_{stack}=C_{MIM}$ in series with $C_{off}/N$, where N is the number of devices. It can be noted that the Coff here includes the effect of the added compensation capacitance. Also in this case embodiments are possible where less than N−1 capacitors can be added, starting with the transistor closest to the voltage source, to improve the effective stack height while not necessarily attaining equal voltage division.

Several embodiments of the present application specify the presence of a first RF terminal and a second RF terminal. However, the person skilled in the art will understand that embodiments of the present disclosure are also directed to the presence of terminals which are not RF terminals.

Additionally, several embodiments of the present application are directed to a stack of switches, such as FET switches. However, the person skilled in the art should appreciate that elements different from switches (such as inductors, resistors, capacitors, diodes and so on) can be provided and the teachings of the present disclosure can be applied to these embodiments as well.

Furthermore, while several embodiments of the present disclosure deal with digitally tuned capacitors (DTCs), the teachings of the present disclosure can be applied to fields where stacked devices are used different from the field of DTCs, such as switches or attenuators.

In the compensation schemes shown in the above figures at least one of the RF terminals is grounded. A typical application would be the DTC in shunt to ground. However, generally speaking, the stack can be used in applications where none of the terminals RF+ or RF− is grounded, e.g., using the DTC in series. In such cases, the above compensation schemes are not bidirectional and are effective only if the stack is driven with the voltage source as shown in the above figures and not vice versa. Moreover, such schemes are effective if the RF− terminal (or the Q1 source terminal in FIG. 11) is either matched or grounded. If RF− is not matched when RF+ is driven (Q3 drain in FIG. 11), there are load mismatch conditions whereby the signal delivered to the load would reflect back into Q1 source. When the signal is incident on a compensated stack port (for example the Q1 source terminal in FIG. 11) that was compensated to be driven using the other port (Q3 drain in FIG. 11), the effective stack height can be worse than an uncompensated stack. This is a probable event when the stack (or DTC) is used in a tuner for impedance matching.

Figure 15:
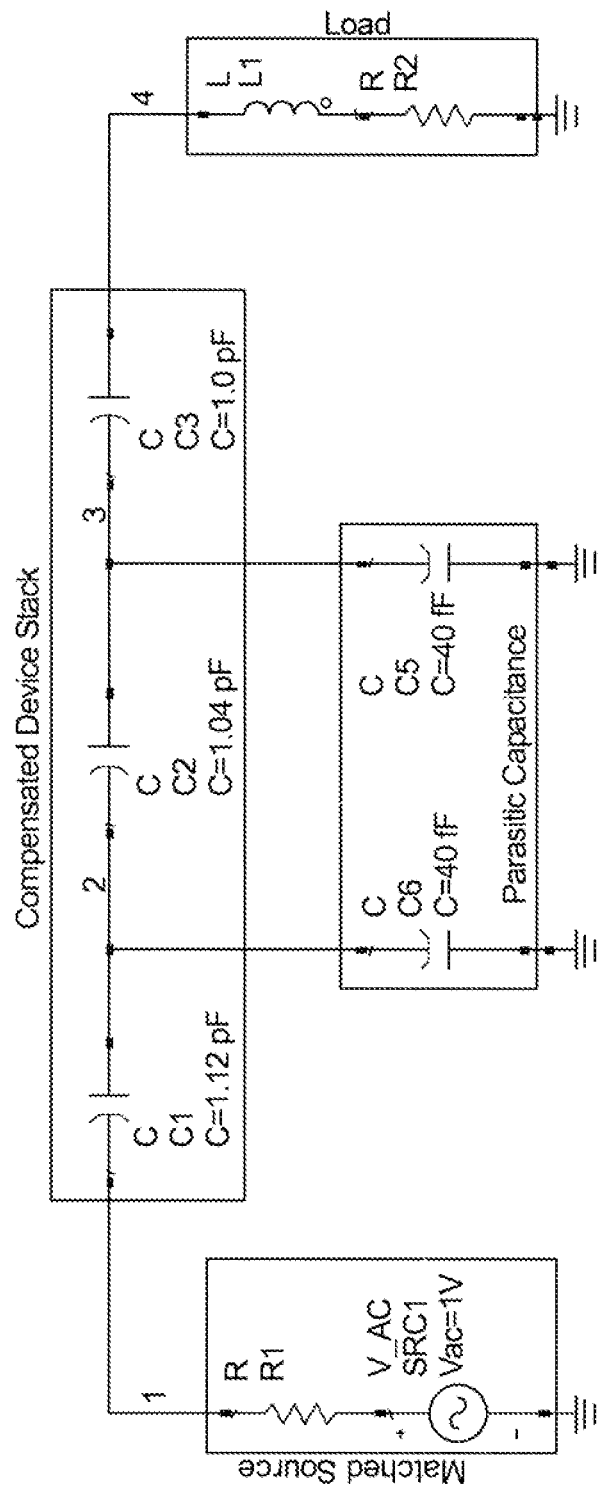
FIGS. 15-17 show behavior of asymmetric stack in presence of a reactive load.
Figure 16:
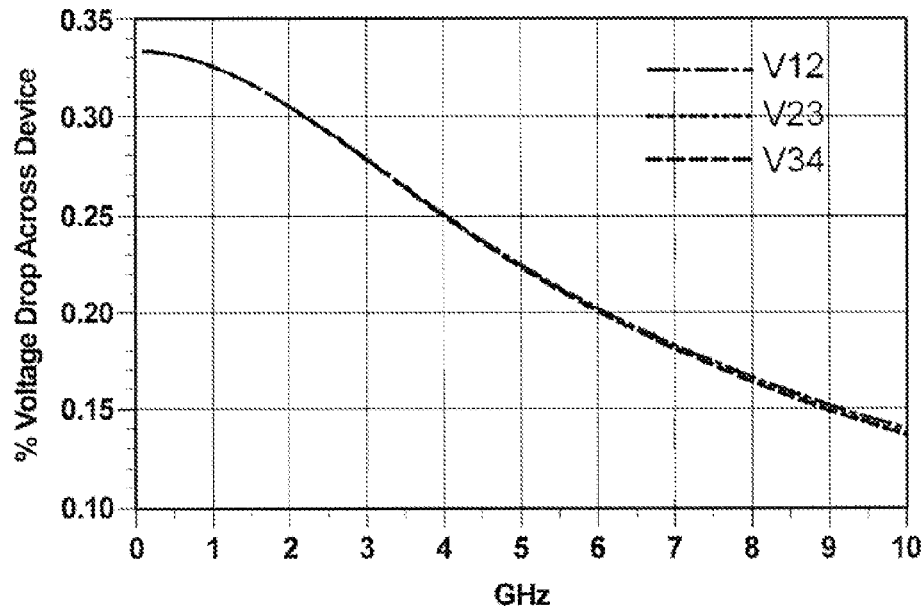
Figure 17:
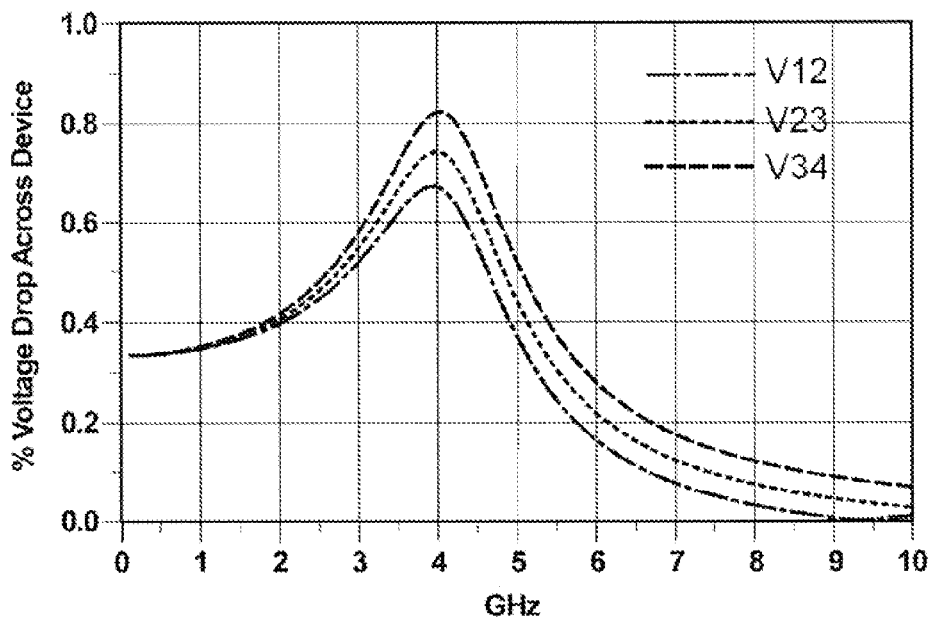

FIGS. 15-17 show the above problem and illustrate how voltage divides across an asymmetrically compensated stack when under mismatched load conditions. In particular, as shown in FIG. 15, V12 (voltage across C1), V23 (voltage across C2) and V34 (voltage across C3) are sensibly different among themselves when the load is reactive (see inductive reactance component L1 in FIG. 15). It should be noted that in the representation of FIG. 15 the values C2, C3 represent the combined Cds-OFF+Cb capacitances, similarly to what shown in FIG. 12.

The present disclosure overcomes the above problem by providing embodiments according to which the bottom compensation capacitors have the same value of the top compensation capacitors. More generally, assuming that the devices do not have the same Coff embodiments are provided where compensation capacitances are provided so that the resulting capacitance of the compensated devices is such that the values of such resulting capacitances are symmetrical with respect to the center of the stack. In other words, the stack is symmetrically compensated. For example, with reference to the exemplary scheme of FIG. 13, and assuming that the Coff of the switches are the same, this would mean that the capacitance value of the compensation capacitors, from top to bottom, would be 45, 30, 18, 30 and 45 fF. Although such embodiment will not allow an equal voltage division across the FETs, it still improves the effective stack height compared to an uncompensated stack and it provides bi-directionality for those applications where such bi-directionality is requested. In addition, a symmetric configuration lessens the stack sensitivities to less than ideal conditions.

Figure 18:
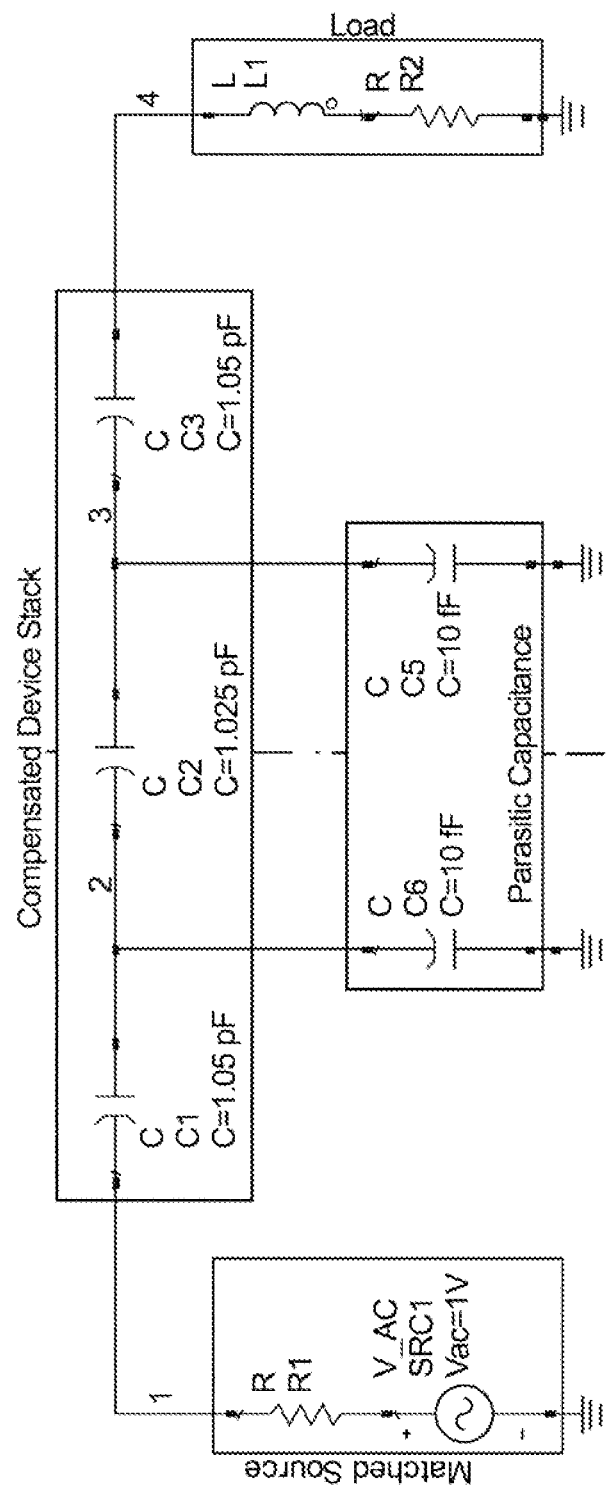
FIGS. 18-20 show behavior of a symmetric stack in presence of a reactive load.
Figure 19:
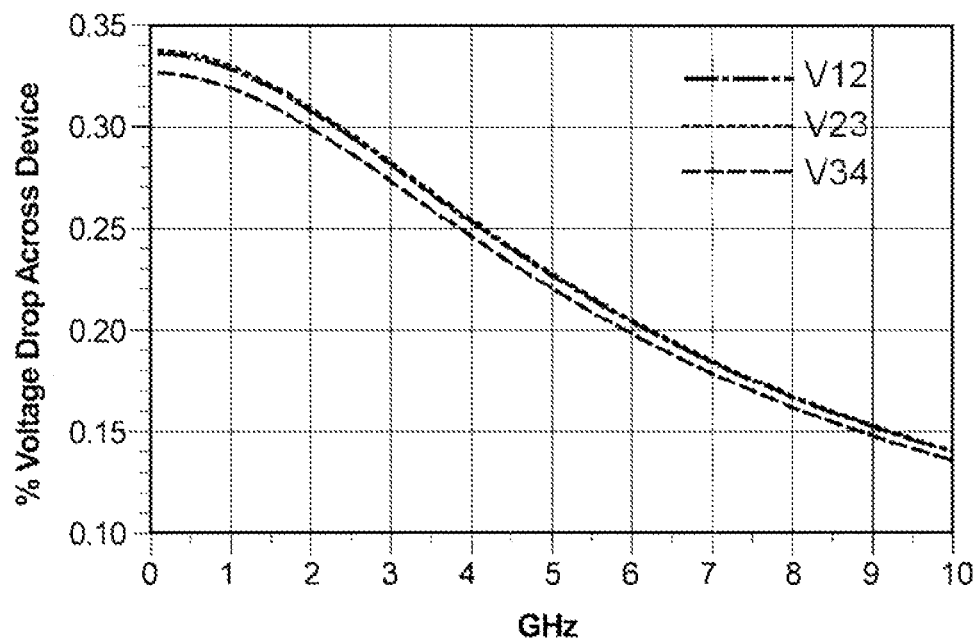
Figure 20:
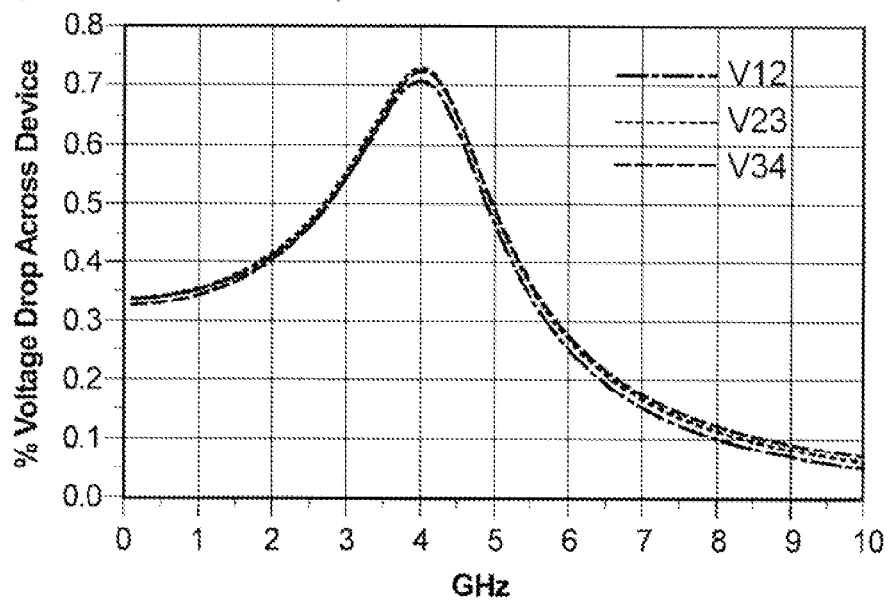

Reference can be made, for example, to FIGS. 18-20, where a symmetric scheme is shown. As shown in FIG. 18, a symmetric scheme is provided, where the 'top' (nearest to the source) capacitance C1 has the same value of the 'bottom' (farthest from the source) capacitance C3. The waveforms of FIGS. 19 and 20 show how V12. V23 and V34 are almost identical to each other. In particular, comparison between FIG. 17 and FIG. 20 shows the advantage of adopting a symmetrical arrangement in cases with a reactive load.

Turning now to the diagram of FIG. 14 (see also FIG. 21), it should be noted that placement of the MIM capacitors (40) across the FET stack in presence of parasitic capacitance can make the tunable capacitor stack non-reciprocal. In other words, the stack shown in FIG. 14 is not bi-directional in the sense that the effective capacitance and voltage handling differs depending on the port (RF+ or RF−) being driven.

Figure 21:
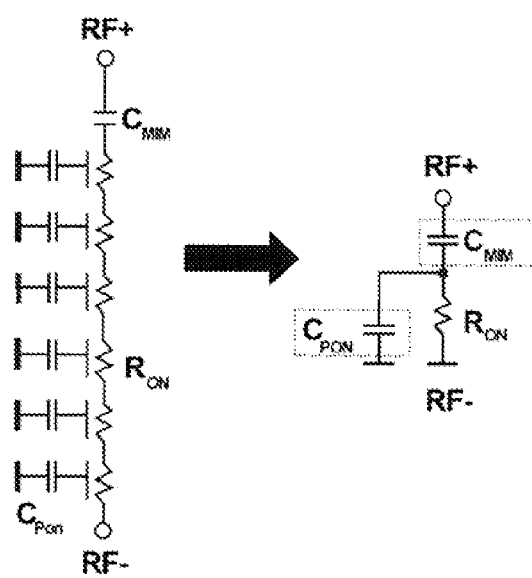
FIG. 21 shows a stack of ON resistances and ON parasitic capacitances of a DTC with a MIM capacitor on top of the stack.
Figure 22:
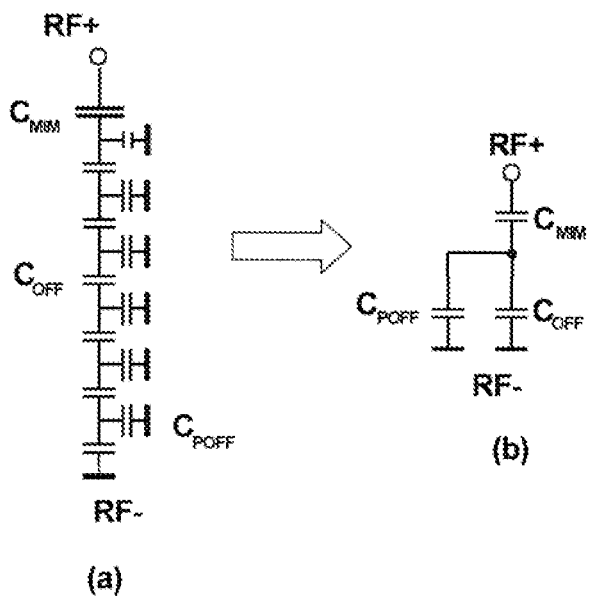
FIG. 22 shows a stack of OFF capacitances and OFF parasitic capacitances of a DTC.

In this respect, FIGS. 21 and 22 show simplified equivalent circuits of the stack of FETs, where the FETs are in an ON condition (FIG. 21) or in an OFF condition (FIG. 22). In FIG. 21, parasitic capacitances Cpon (50) are present to a ground node, and the stack in the ON condition can be represented by the equivalent circuit shown in FIG. 21(b). In the ON condition of FIGS. 21(a) and 21(b), when driving RF+, the parasitic capacitance Cpon is not seen because the impedance of Ron is much lower than the impedance of Cpon. Moreover, when driving RF−, Cpon appears in parallel with CMIM, thus increasing the effective capacitance. Therefore, in the ON condition, presence of the parasitic capacitances Cpon, although not necessarily a problem, can be a source of non-bidirectionality.

FIGS. 22(a) and 22(b) show a stack or arm of FET transistors with a MIM or MM capacitor on top in the OFF condition, where the circuit of FIG. 22(b) is the simplified circuital equivalent of the OFF arm of FIG. 22(a). In such case, when driving RF+, the effective capacitance seen is different from the capacitance seen when driving RF−. Such undesired difference can be explained, for example, with reference to the diagram of FIG. 23.

Figure 23:
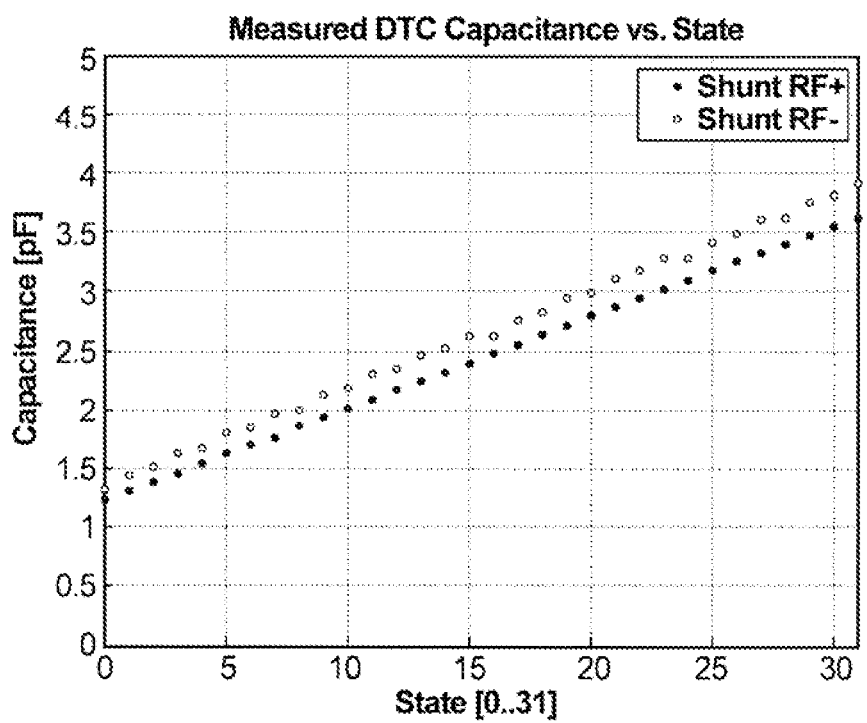
FIG. 23 shows a diagram where the capacitance of the circuit of FIG. 1 is measured as a function of the various states that the circuit of FIG. 1 can assume when driven at either RF+ or RF−.

In particular, FIG. 23 shows a diagram where the capacitance of the circuit of FIG. 1 is measured as a function of the various states that the circuit of FIG. 1 can assume. The 5-bit circuit of FIG. 1 can assume 32 states from 00000 (state 0, which corresponds to all bits being in the OFF state as shown in FIG. 22) to 11111 (state 31, which corresponds to all bits being in the ON state as shown in FIG. 21). The capacitance of the circuit for each state is represented in FIG. 23 for each of the 32 states. The top line of dots of FIG. 23 represents values where RF− is driven (shunt RF+), while the bottom line of dots of FIG. 23 represents values where RF+ is driven (shunt RF+). The difference in capacitance value for each state is a clear indication of the lack of bi-directionality of the circuit of FIG. 1 because of the presence of an offset due to the presence of a parasitic C term.

Figure 24:
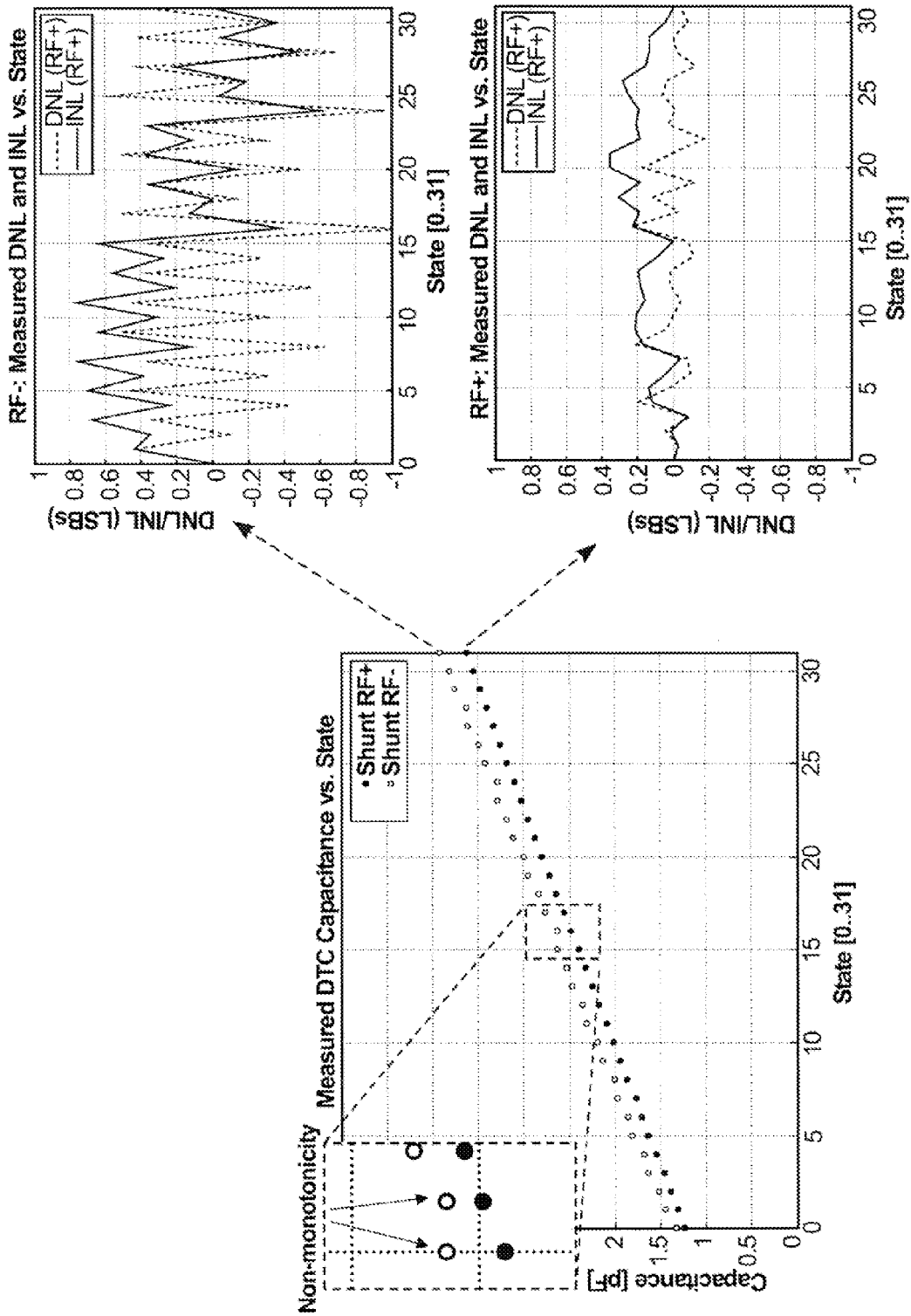
FIG. 24 shows diagrams indicating capacitance asymmetry depending on the polarity of the circuit of FIG. 1, i.e. whether the circuit is RF+ driven or RF− driven.

FIG. 24 shows diagrams indicating, in detail, the asymmetry of the DTC capacitance depending on the polarity in the shunt, i.e. whether the circuit is RF+ driven or RF− driven. In particular, FIG. 24(a) shows that there is a non-monotonicity of the capacitance values in the shunt RF− case, meaning that the capacitance for state 16 has a value that is inferior to the value for state 15. Such lack of monotonicity represents a problem, especially in closed loop applications. Such issue can be better appreciated in the diagrams of FIGS. 24(b) and 24(c) where differential linearity (DNL) and integral linearity (INL) signals are shown. In particular, DNL represents the actual step size versus the ideal step size, while INL represents the difference between capacitance values and a reference straight line drawn through the end points. Ideally, both DNL and INL should be equal to zero across the various states. The diagrams of FIGS. 24(b) and 24(c) show that the Shunt RF+ condition (circuit RF+ driven) of FIG. 24(c), although not ideal, is much better than the Shunt RF− condition (circuit RF− driven) of FIG. 24(b) where there is a large discrepancy between the ideal and real values of DNL and INL.

Figure 25:
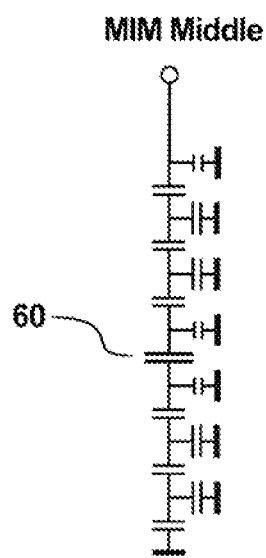
FIG. 25 shows a stack of OFF capacitances of digitally tunable capacitors (DTC) with metal-insulator-metal (MIM) capacitors in the middle of the stack.
Figure 26:
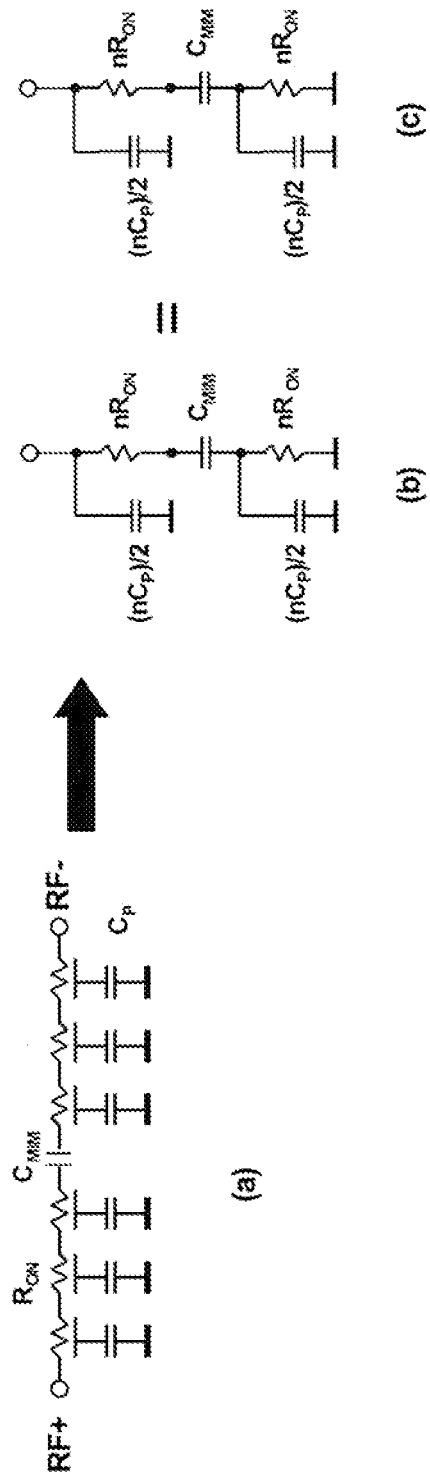
FIG. 26 shows an equivalent circuit with ON resistances and ON parasitic capacitances of a DTC with MIM capacitors in the middle of the stack.

A first embodiment of the present disclosure to solve the above mentioned problem is shown in the circuit of FIG. 25, where MIM or MM capacitor (60) is placed in the middle of the stack. See also FIGS. 26(a)-26(c). The presence of MIM capacitor (60) in the middle neither eliminates nor compensates the parasitic capacitance Cp. Rather, the parasitic capacitances are now symmetric about the MIM capacitor, so that the RF+ and RF− mirror each other both in the ON state and in the OFF state. Therefore, such embodiment eliminates asymmetries in the DTC capacitance, thus allowing the same capacitance value to be obtained whether driving RF+ or RF−. Moreover, the RF− DNL is improved, and the RF− quality factor Q is improved. Possible drawbacks of such embodiment are that the RF+ DNL degrades and the RF+ quality factor Q degrades.

In some embodiments, placement of a single MIM capacitor in the middle of the stack can not be advisable due to breakdown voltage limitations of the MIM capacitor. In such case, two or more MIM capacitors can be provided in series, to overcome such limitations.

Figure 27:
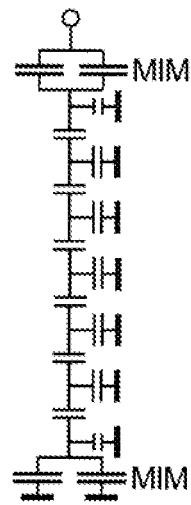
FIG. 27 shows a stack of OFF capacitances and parasitic capacitances of a DTC with MIM capacitors both on the top and the bottom of the stack, thus providing a symmetrical configuration.
Figure 28:
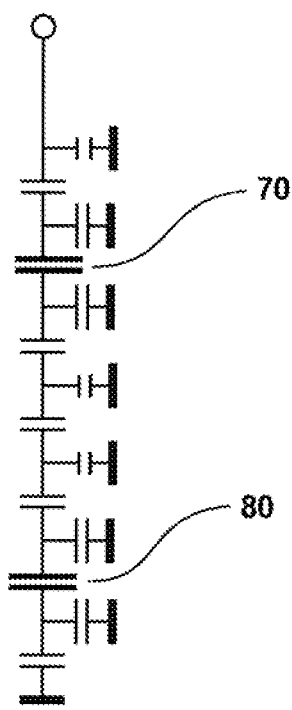
FIG. 28 shows a further symmetrical configuration of a stack of OFF capacitances and parasitic capacitances of a DTC including MIM capacitors.

According to further embodiments of the present disclosure, MIM capacitors can be placed in a variety of positions as long as they are symmetrical with respect to the center of the stack. By way of example, one possible placement could be to double the MIM capacitance and put one on each end of the stack, as shown in FIG. 27. In order to obtain the same effect of a single MIM, the MIM capacitances have been doubled, as shown in the figure. FIG. 28 shows a further embodiment of the present disclosure where MIM capacitors (70, 80) have been placed in positions that provide an overall symmetrical configuration.

Figure 29:
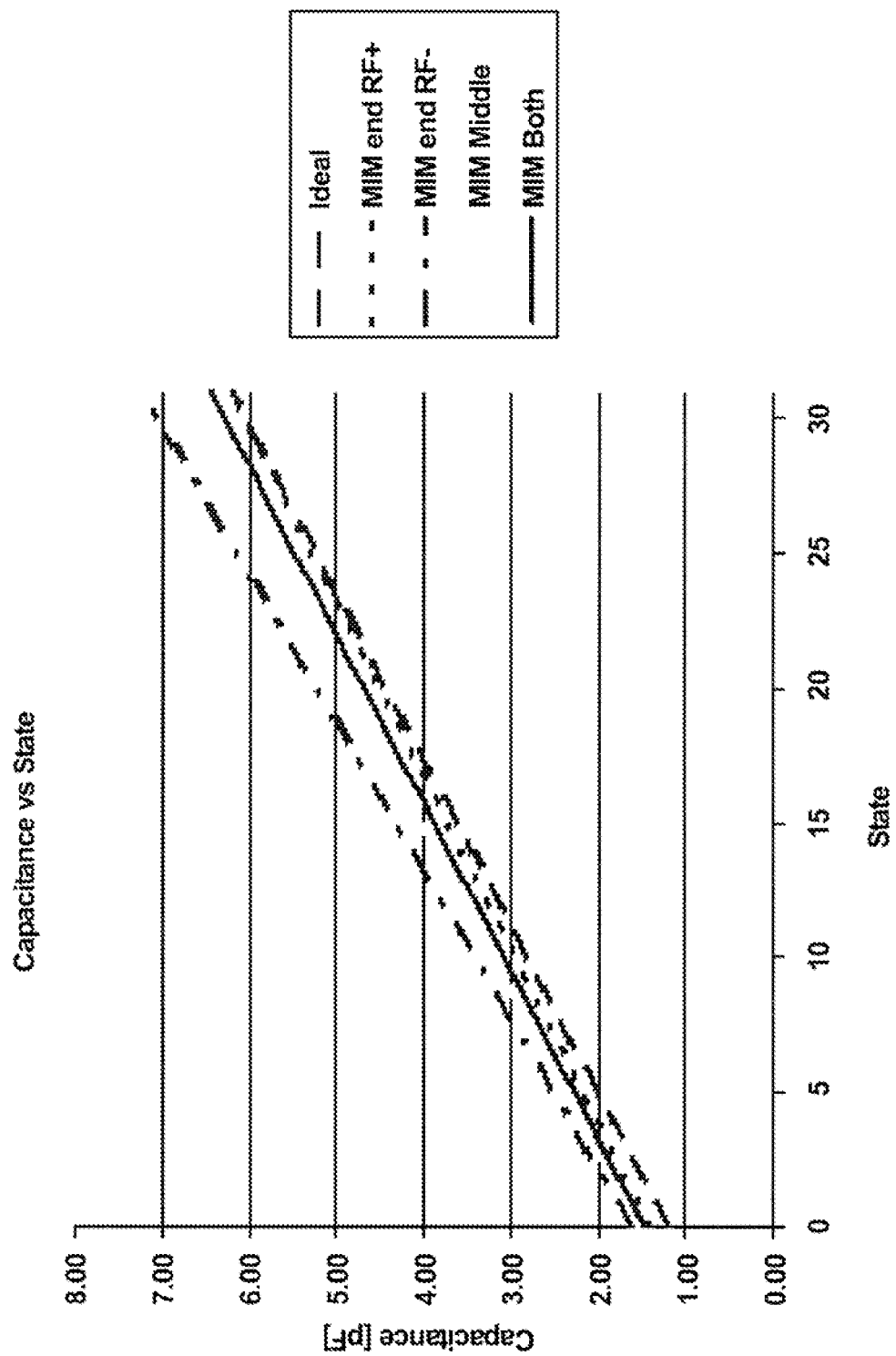
FIG. 29 shows a diagram where the capacitance of the circuit of FIG. 1 is measured as a function of the various states that the circuit of FIG. 1 can assume and as a function of the location of the MIM capacitors.

FIG. 29 shows a further capacitance vs. state diagram, this time with reference to five different scenarios: 1) ideal (first line from the bottom), assuming no parasitic C to ground 2) MIM at the RF+ end (second line from the bottom); 3) MIM at both ends (third line from the bottom); 4) MIM in the middle (fourth line from the bottom); and 5) MIM at the RF− end (fifth line from the bottom, first from the top). The diagram of FIG. 29 shows how for a typical scenario, the capacitance for the MIM at one end approach depends strongly on which end is driven (see distance between line 2 and line 5), while the symmetric approach is bilateral and closer to ideal.

Figure 30:
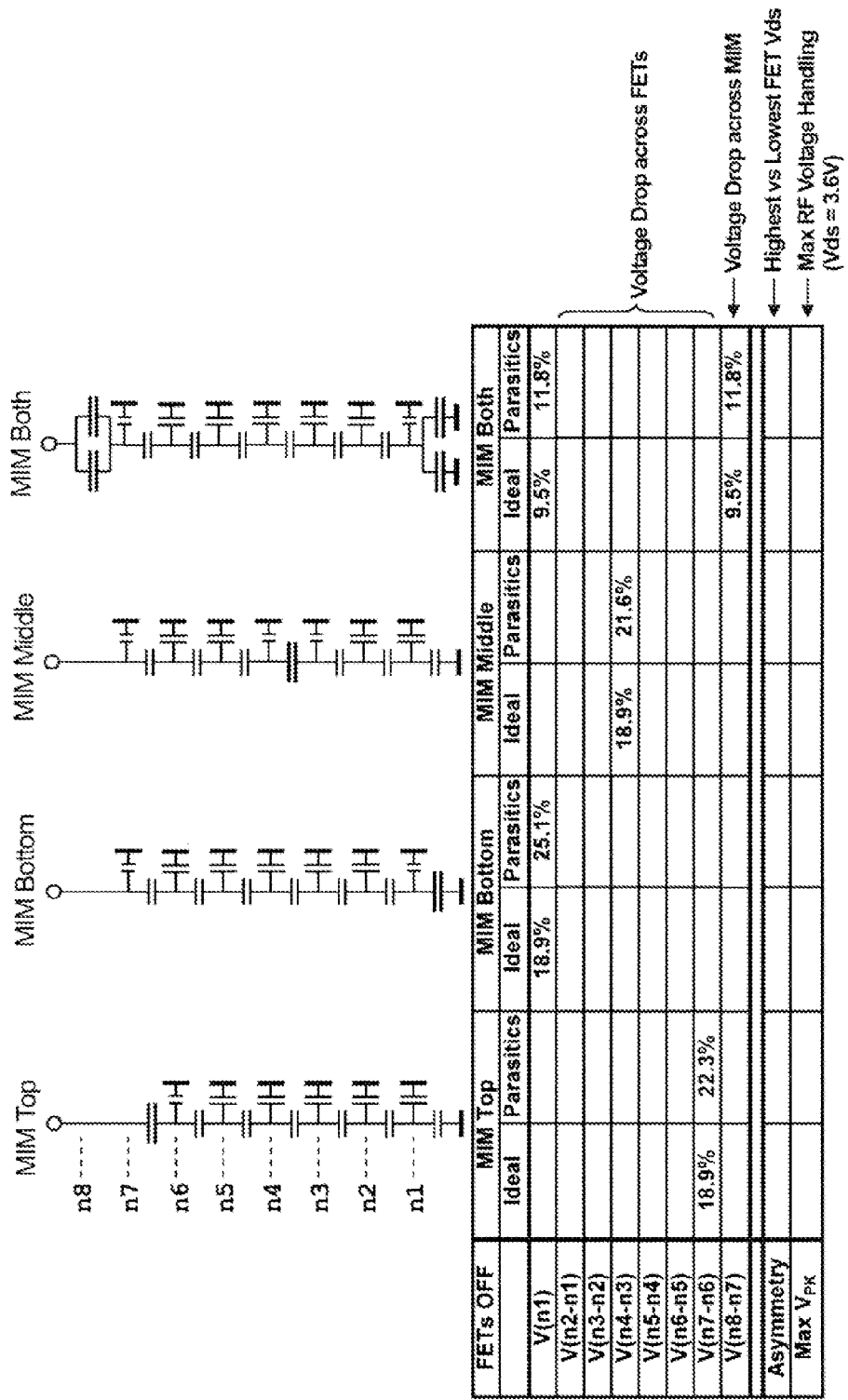
FIG. 30 shows a table where the four stack configurations of FIG. 10 are analyzed in terms of ideal voltage distribution and real voltage distribution due to the presence of parasitic capacitances.

FIG. 30 shows a table similar to the diagram of FIG. 29. FIG. 30 shows the effects of MIM placement on voltage division. The columns with the 'Parasitics' header take into account the parasitic C to ground. The last row (Max Vpk) is the maximum voltage capability of each configuration. It can be noted that the embodiment with MIM at the top and the embodiment with MIM at the bottom give different results, which is not desired because it means that the configuration is not bi-directional. It should also be noted that the table of FIG. 30 does not include any compensation.

Figure 31:
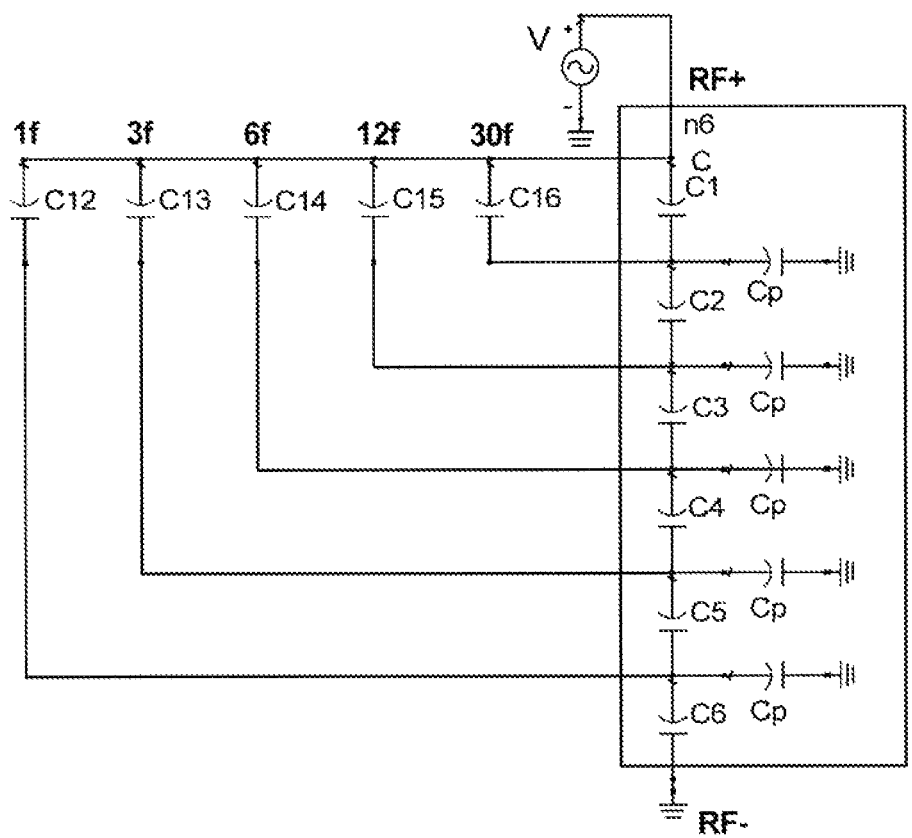
FIG. 31 shows a circuital diagram in accordance with a further embodiment of the disclosure.

FIG. 31 shows a further embodiment of the present disclosure. A stack of devices showing Coff capacitances C1 ... C6 and respective parasitic capacitances as mentioned above is shown. According to this further embodiment, compensation capacitances C12 ... C16 are provided. Differently from some of the previous embodiments where the compensation capacitances where provided in parallel to each device of the stack, in the present embodiment a first compensation capacitance C16 is provided across (in parallel with) the first device, a second compensation capacitance C15 is provided across the series of the first and second device, a third compensation capacitance C14 is provided across the series of the first, second and third device, and so on. The last compensation capacitance is provided across the series of all devices with the exclusion of the device farthest from the source (n-th device). Embodiments can also be provided where the compensating capacitors do not proceed up to the (n−1)-th device of the stack, but only proceed up to the i-th device of the stack, i=1, 2, ..., n−1. In general, according to the embodiment of FIG. 31, i (with i=1, 2, ... n−1) compensating capacitors can be provided for each embodiment, each embodiment comprising compensating capacitors located across the first device, the series of the first and second device, the series of the first, second and third device, up to the series of all devices from the first device to the i-th device.

Figure 32:
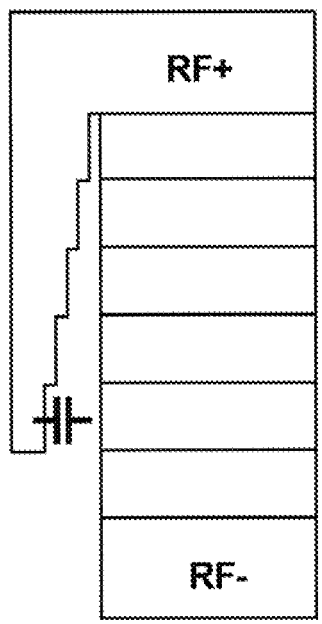
FIGS. 32 and 33 show examples of layouts in order to implement the circuital diagram of FIG. 31.
Figure 33:
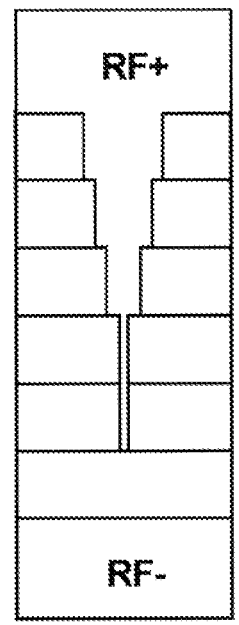

FIGS. 32 and 33 show exemplary layouts of the compensation capacitors in accordance with the embodiment of FIG. 31, where Metal-Metal (MM) compensation capacitors are used, by way of example. In particular. FIGS. 32 and 33 are views from the top of the stack of switches (disposed. e.g., in an interdigitated manner where the source of each switch is interdigitated with the drain of the device) disposed between the first terminal RF+ and the second terminal RF−.

As shown in FIG. 32, a capacitive effect is obtained by adding metal to the side of the switches in a controlled amount and at a controlled distance from each switch to obtain a controlled capacitive metal-insulator-metal effect between the RF+ node and each node of the stack. It should be noted how, in FIG. 32, the distance between the added metal and the stacked devices is variable (the larger the distance the lower the capacitance), to obtained a controllable capacitance effect.

In the embodiment of FIG. 33 the metal is added on top of the switches along a substantially central region of the same. In this case, the variable capacitive effect is obtained through control of the amount of metal deposited on the top of each switch.

Figure 34:
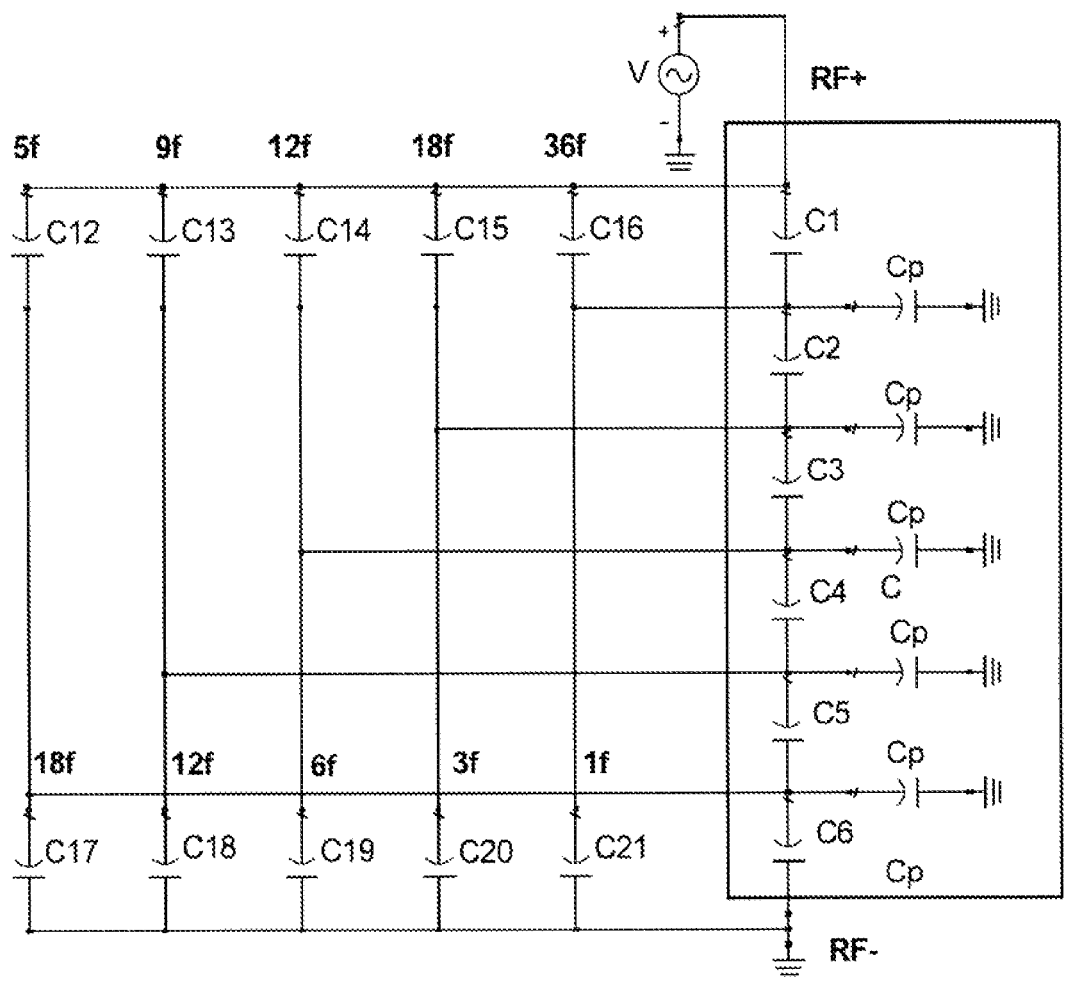
FIG. 34 shows a circuital diagram in accordance with a further embodiment of the disclosure.

FIG. 34 shows another embodiment of the present disclosure, similar to the embodiment of FIG. 31. Differently from the embodiment of FIG. 31, the embodiment of FIG. 34 shows additional compensation capacitances C17 ... C21. A first additional compensation capacitance C17 is provided across (in parallel with) the last (n-th) device, a second compensation capacitance C18 is provided across the series of the n-th and (n−1)-th device, a third compensation capacitance C17 is provided across the series of the n-th, (n−1)-th and (n−2)-th device, and so on. The last additional compensation capacitance is provided across the series of all devices with the exclusion of the device closest to the source ($1^{st}$ device). Embodiments can also be provided where the additional compensating capacitors do not proceed up to the second device of the stack, but only proceed up to the (n−i+1)-th device of the stack, i=1, 2, ..., n−1, depending on how many compensation capacitors have been provided on the top side of the stack. In general, according to the embodiment of FIG. 34, i (with i=1, 2, ... n−1) compensating capacitors can be provided on each side of the stack for each embodiment, each embodiment comprising compensating capacitors located across the first device, the series of the first and second device, the series of the first, second and third device, up to the series of all devices from the first device to the i-th device, and corresponding compensating capacitors located across the n-th device, the series of the n-th and (n−1)-th device, the series of the n-th, (n−1)-th and (n−2)-th device, up to the series of all devices from the first device to the (n−i+1)-th device.

Figure 35:
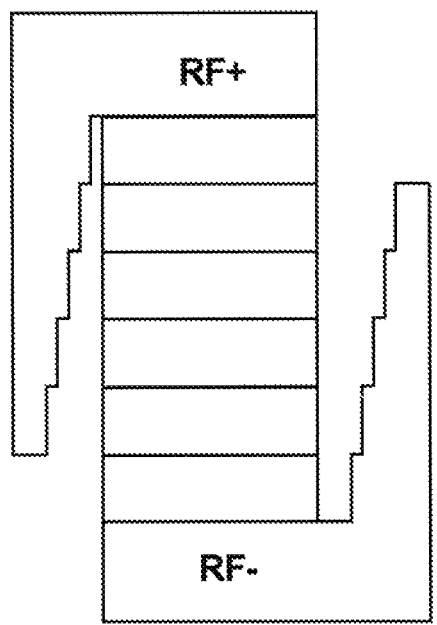
FIGS. 35 and 36 show examples of layouts in order to implement the circuital diagram of FIG. 34.
Figure 36:
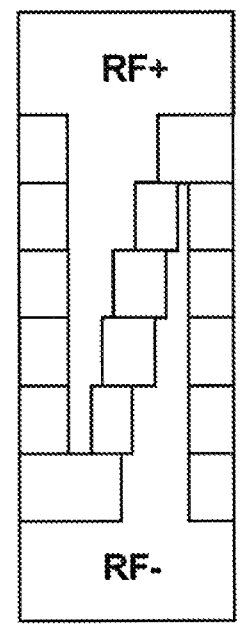

FIGS. 35 and 36 show exemplary layouts of the compensation capacitors in accordance with the embodiment of FIG. 34. The metal is added on the side or on top of the switches similarly to the embodiment of FIGS. 32 and 33.

Figure 37:
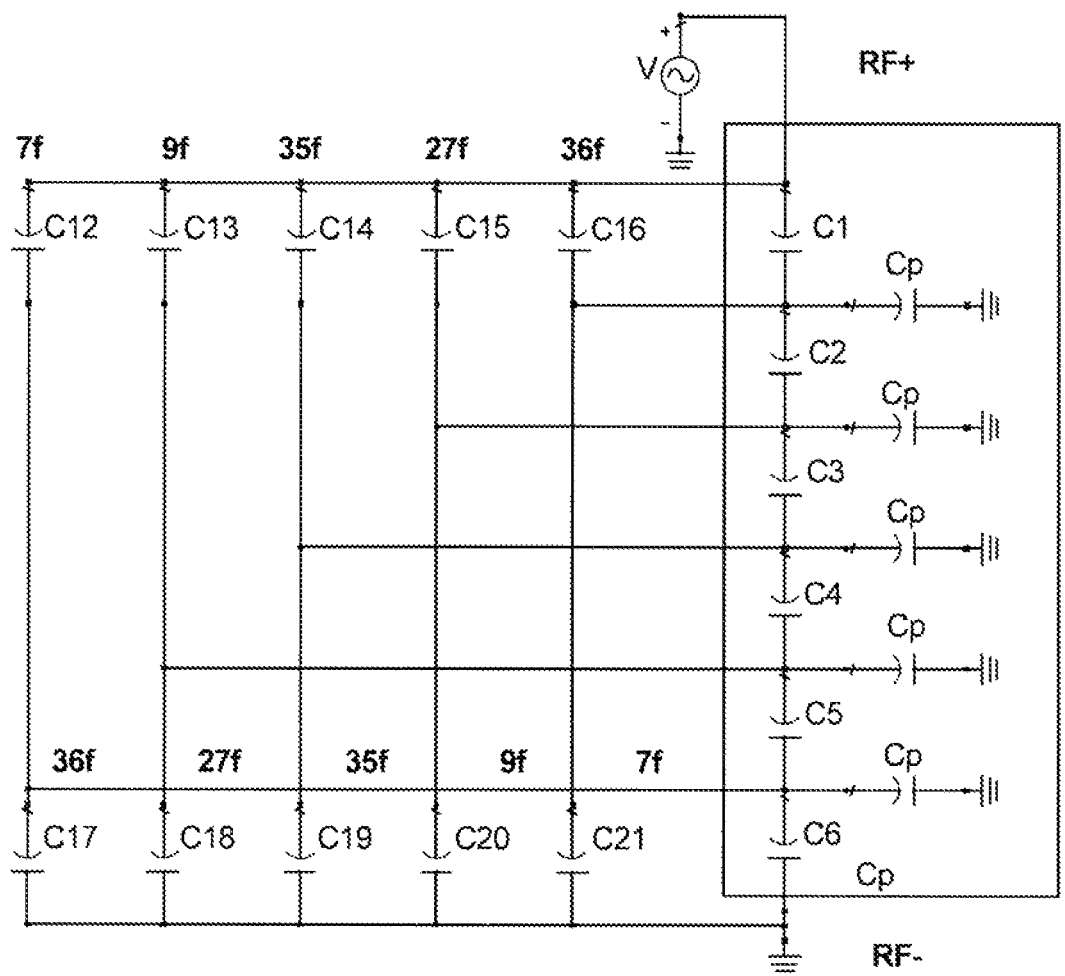
FIG. 37 shows a circuital diagram in accordance with a further embodiment of the disclosure.

FIG. 37 shows a further embodiment of the present disclosure, similar to the embodiment of FIG. 34. In the embodiment of FIG. 37, the compensation is symmetric. Each compensating capacitor on the top of the figure has a corresponding compensating capacitor on the bottom of the figure so that the resulting capacitance value on the top of the stack is the same as the resulting capacitance value on the bottom of the stack. As shown in FIG. 37, the resulting capacitance value between the first and the second node (36 pF) is the same as the resulting capacitance value between the n-th and the (n−1)-th node. Similarly, the resulting capacitance value between the first and the third node (27 pF) is the same as the resulting capacitance value between the n-th and the (n−2)-th node, and so on.

Figure 38:
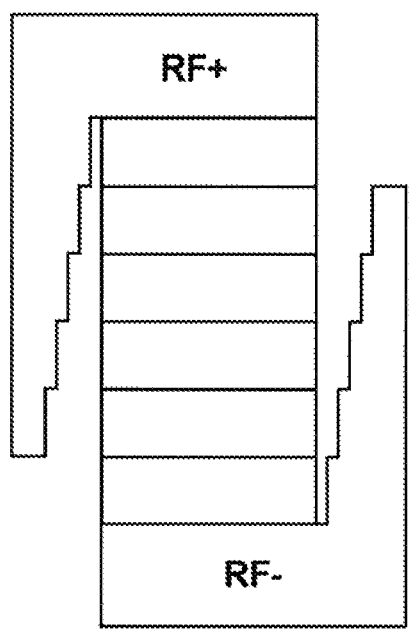
FIGS. 38 and 39 show examples of layouts in order to implement the circuital diagram of FIG. 37.
Figure 39:
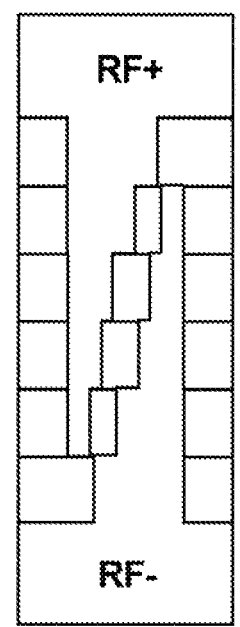

FIGS. 38 and 39 show exemplary layouts of the compensation capacitors in accordance with the embodiment of FIG.

37. The metal is added on the side or on top of the switches similarly to the embodiment of FIGS. 35 and 36.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The examples set forth above are provided to give those of ordinary skill in the art a complete disclosure and description of how to make and use the embodiments of the devices and methods for voltage handling of digitally tunable capacitors of the disclosure, and are not intended to limit the scope of what the inventors regard as their disclosure. Modifications of the above-described modes for carrying out the disclosure may be used by persons of skill in the video art, and are intended to be within the scope of the following claims.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A circuit coupled between a first terminal and a second terminal, comprising:
    a plurality of stacked elements, the stacked elements proceeding from a first element of the stacked elements, closest the first terminal and farthest from the second terminal to an n-th element of the stacked elements farthest from the first terminal and closest to the second terminal,
    a plurality of compensating capacitors associated with the stacked elements,
wherein:
    nodes between the elements exhibit parasitic capacitances,
    the first terminal is a terminal through which a voltage source is coupled to the circuit;
    the stacked elements comprise a first set of elements close to the first terminal and far from the second terminal and a second set of elements far from the first terminal and close to the second terminal,
    the compensating capacitors comprise a first set of compensating capacitors associated with the first set of elements and a second set of compensating capacitors associated with the second set of elements,
    the first set of compensating capacitors comprises i capacitors (i=1, 2, . . . ), the first capacitor of the first set of capacitors being located in parallel with a first element of the first set of elements, the second capacitor of the first set of capacitors being located in parallel with a series of the first element and a second element of the first set of elements, the third capacitor of the first set of capacitors being located in parallel with a series of the first element, the second element and a third element of the first set of elements and so on,
    the second set of compensating capacitors comprises i corresponding capacitors (i=1, 2, . . . ), the first capacitor of the second set of capacitors being located in parallel with a first element of the second set of elements, the second capacitor of the second set of capacitors being located in parallel with a series of the first element and a second element of the second set of elements, the third capacitor of the second set of capacitors being located in parallel with a series of the first element, the second element and a third element of the second set of elements and so on, and
    a combination of elements of the stacked elements, parasitic capacitances and compensating capacitors at each node provides a compensated capacitance value for that node, the compensated capacitances values of the nodes being symmetric with respect to a central node of the nodes.

2. The circuit of claim 1, wherein the elements are selected between capacitors, resistors, transistors, diodes and inductors.

3. The circuit of claim 1, wherein the first and second terminals are RF terminals.

4. The circuit of claim 1, wherein the compensating capacitors are located on the side of the stacked elements.

5. The circuit of claim 1, wherein the compensating capacitors are located above the stacked elements.

6. The circuit of claim 1, wherein capacitance values of the compensating capacitors of the first and second set of compensating capacitors are monotonically descending from a largest capacitance value of the first compensating capacitor to a lowest capacitance value of the i-th compensating capacitor.

7. The circuit of claim 6, wherein the compensating capacitors of the first and second set are located above or on the side of the stacked elements, each occupying an area which is monotonically descending from a largest area of the first compensating capacitor to a lowest area of the i-th compensating capacitor.

8. A circuit coupled between a first terminal and a second terminal, comprising:
    a plurality of stacked switches, the stacked switches proceeding from a first switch of the stacked switches, closest the first terminal and farthest from the second terminal to an n-th switch of the stacked switches farthest from the first terminal and closest to the second terminal,
    a plurality of compensating capacitors associated with the stacked switches,
wherein:
    nodes between the switches exhibit parasitic capacitances,
    the first terminal is a terminal through which a voltage source is adapted to be coupled to the circuit;
    the stacked switches comprise a first set of switches close to the first terminal and far from the second terminal and a second set of switches far from the first terminal and close to the second terminal,
    the compensating capacitors comprise a first set of compensating capacitors associated with the first set of switches and a second set of compensating capacitors associated with the second set of switches,
    the first set of compensating capacitors comprises i capacitors (i=1, 2, . . . ), the first capacitor of the first set of capacitors being located in parallel with a first switch of the first set of switches, the second capacitor of the first set of capacitors being located in parallel with a series of the first switch and a second switch of the first set of switches, the third capacitor of the first set of capacitors being located in parallel with a series of the first switch, the second switch and a third switch of the first set of switches and so on,
    the second set of compensating capacitors comprises i corresponding capacitors (i=1, 2, . . . ), the first capacitor of the second set of capacitors being located in parallel with a first switch of the second set of switches, the second capacitor of the second set of capacitors being located in parallel with a series of the first switch and a second switch of the first set of switches, the third capacitor of the second set of capacitors being located in parallel with a series of the first switch, the second switch and a third switch of the second set of switches and so on, and a combination of switches of the stacked switches, parasitic capacitances and compensating capacitors at each node provides a compensated capacitance value for that node, the compensated capacitances values of the nodes being symmetric with respect to a central node of the nodes.

* * * * *